United States Patent [19]

Göttsche

[11] Patent Number: 5,475,489
[45] Date of Patent: Dec. 12, 1995

[54] DETERMINATION OF INDUCED CHANGE OF POLARIZATION STATE OF LIGHT

[76] Inventor: Allan Göttsche, Nørre Herlevvej 3, DK-3540 Lynge, Denmark

[21] Appl. No.: 150,111
[22] PCT Filed: Jun. 4, 1992
[86] PCT No.: PCT/DK92/00177
§ 371 Date: Nov. 24, 1993
§ 102(e) Date: Nov. 24, 1993
[87] PCT Pub. No.: WO92/21949
PCT Pub. Date: Dec. 10, 1992

[30] Foreign Application Priority Data

Jun. 7, 1991 [DK] Denmark .................. 1086/91

[51] Int. Cl.$^6$ ............................... G01R 33/032
[52] U.S. Cl. ......................... 356/364; 324/244.1
[58] Field of Search ..................... 356/33, 34, 364, 356/365, 366, 367, 368; 250/225; 324/96, 244.1

[56] References Cited

U.S. PATENT DOCUMENTS

| 3,980,949 | 9/1976 | Feldtkeller . | |
|---|---|---|---|
| 4,428,017 | 1/1984 | Vaerewyck et al. | 250/225 |
| 4,613,811 | 9/1986 | Vaerewyck et al. . | |
| 4,648,274 | 3/1987 | Trainer | 356/33 |
| 4,841,234 | 6/1989 | Aoshima et al. . | |
| 4,948,255 | 8/1990 | Watanabe . | |
| 4,998,063 | 3/1991 | Miller | 324/96 |

FOREIGN PATENT DOCUMENTS

| 0284346 | 9/1988 | European Pat. Off. . | |
|---|---|---|---|
| 2017863 | 11/1970 | Germany | 324/96 |
| 2159944 | 12/1985 | United Kingdom . | |

OTHER PUBLICATIONS

W. B. Spillman, Jr. and D. H. McMahon; "Multimode fiber optic sensors based on the photoelastic effect;" pp. 110–114 (no date).

H. J. M. Hulshof, W. R. Rutgers, A. H. v.d. Wey; "Optical voltage sensor: applications in electric power systems;" SPIE vol. 798 Fiber Optic Sensors II (1987); pp. 266–269 (no month).

Primary Examiner—Richard A. Rosenberger
Attorney, Agent, or Firm—Oliff & Berridge

[57] ABSTRACT

A method of determining induced change of polarization state of light in a polarization element comprising transmitting unpolarized light from a light source at the one end of an optical transmitter waveguide means (21) to polarizer means (31) at the other end; polarizing the unpolarized light by the polarizer means (31); transmitting the polarized light through the polarization element (41, 41A, 41B) using at least one reflective optical element; analyzing the transmitted polarized light from the polarization element by an analyzer means (32); and transmitting the analyzed polarized light from the one end of optical receiver waveguide means (22) to a light detector at the other end; wherein the unpolarized light polarized by the polarizer means (31), the polarized light analyzed by the analyzer means (32), or both, are non-collimated; and the polarized light in the light path between the polarizer means (31) and the analyzer means (32) is collected and reflected by at least one reflective imaging optical element (51) so that the analyzed light exits the analyzer means (32) from the same side as the unpolarized light enters the polarizer (31). Further, fiber optic sensor devices for determining induced change of polarization state of light in a polarization element, particularly linear birefringence induced by electric voltage, electric field, and mechanical force, and circular birefringence induced by electric current and magnetic field.

14 Claims, 17 Drawing Sheets

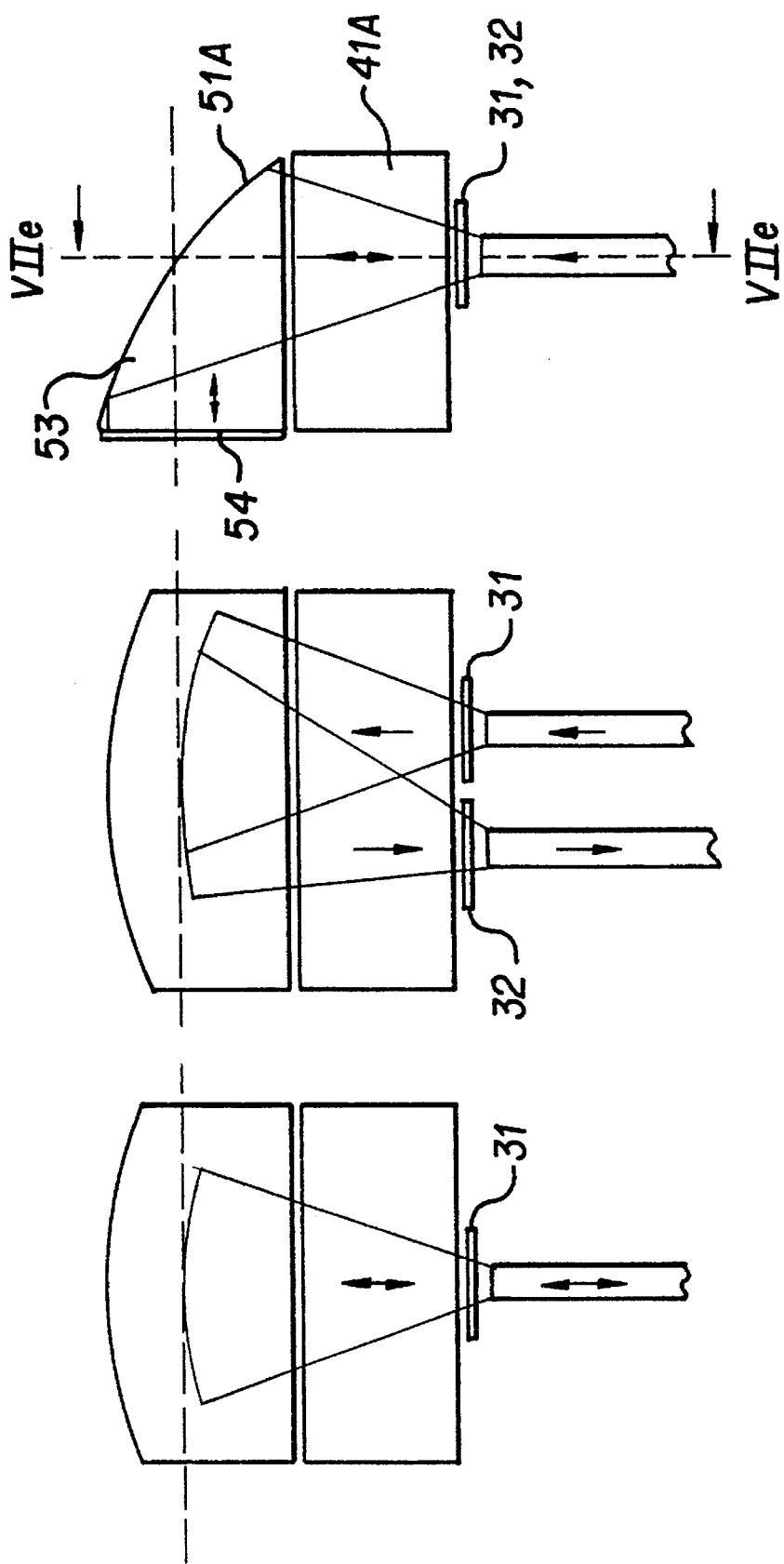

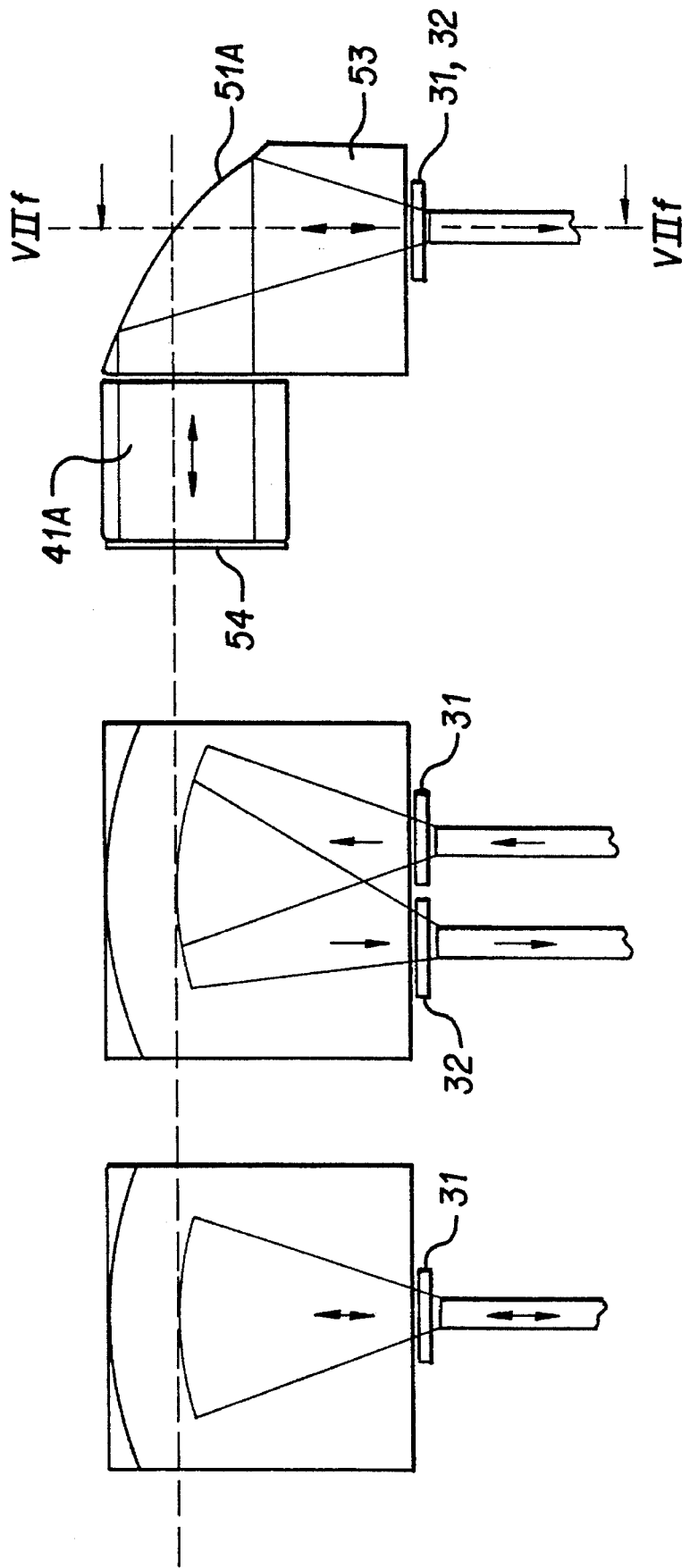

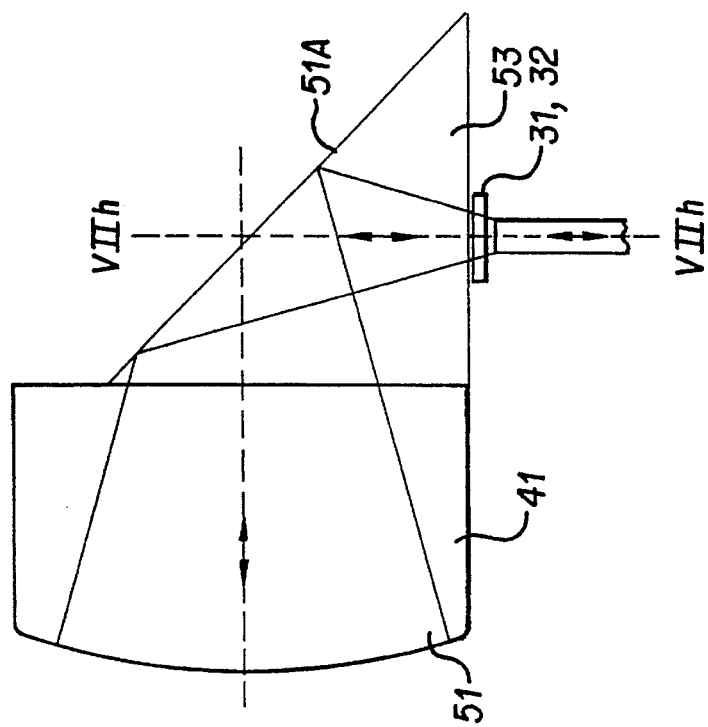
FIG. 7G
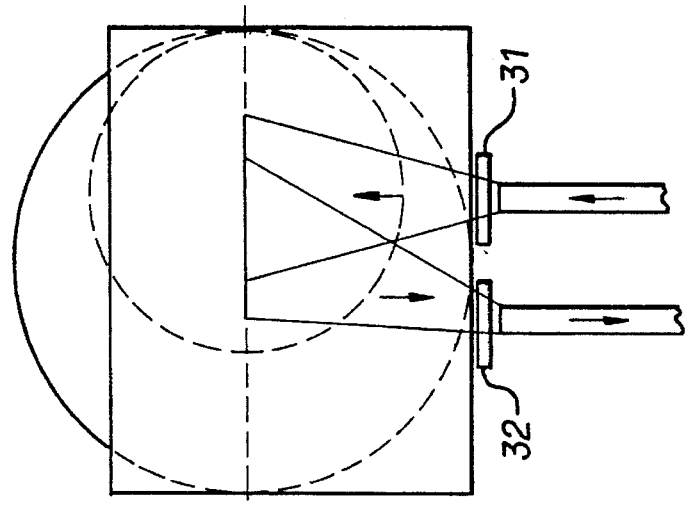
FIG. 7H2
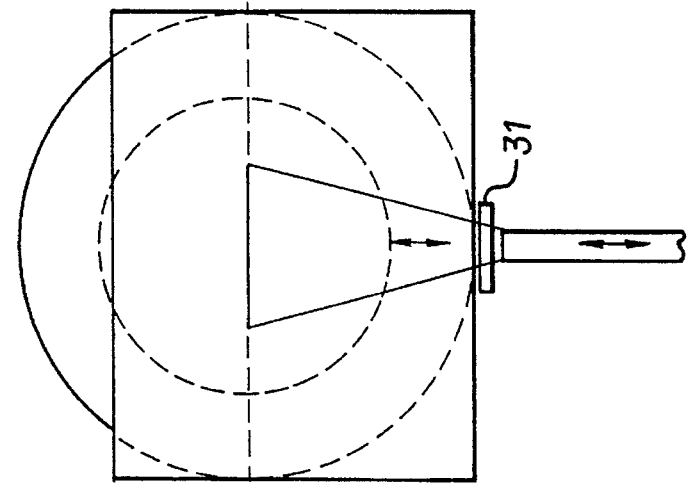
FIG. 7H1

DETERMINATION OF INDUCED CHANGE OF POLARIZATION STATE OF LIGHT

BACKGROUND OF THE INVENTION

1. The Technical Field

The present invention relates to a method of determining induced change of polarization state of light in a polarization element, fiber optic sensor devices for determining such induced change of polarization state of light, particularly linear birefringence induced by an electric voltage, an electric field, and a mechanical force, and circular birefringence induced by an electric current and a magnetic field.

A magnetic field, an electric field, or a mechanical force, or a combination of these, can induce anisotropy in the index of refraction of an optically transparent electrooptic, magnetooptic and/or photoelastic material, respectively, which can be detected by a change of polarization state of light.

Linear birefringence can be induced by an electric field in an electrooptic material by the so-called electrooptic Pockels effect and Kerr effect which can be used in the determination of electric voltage and electric field;

circular birefringence can be induced by a magnetic field in a magnetooptic material by the so-called magnetooptic Faraday effect which can be used in the determination of electric current and magnetic field; and linear birefringence can be induced by a mechanical force in a photoelastic material by the so-called photoelastic effect which can be used in the determination of mechanical force e.g. acceleration and pressure.

Generally, induced change of polarization state of light in a polarization element is used in fiber optic polarimetric optical sensors and the induced change can be determined by:

a) transmitting unpolarized light from a light source at the one end of an optical transmitter waveguide means to polarizer means at the other end;

b) polarizing the unpolarized light by the polarizer means;

c) transmitting the polarized light through a polarization element;

d) analyzing the transmitted polarized light from the polarization element by an analyzer means; and e) transmitting the analyzed polarized light from the one end of an optical receiver waveguide means to a light detector at the other end;

wherein the unpolarized light is collimated by input coupling means between the optical transmitter waveguide means and the polarizer means, and the analyzed polarized light is focused by output coupling means onto the optical transmitter waveguide means, said coupling means consisting of lenses or graded index rod lenses.

Specifically for a fiber optic magnetooptic current sensor, it has been suggested that the transmission of the polarized light through the polarization element is provided by using at least one plane reflective optical surface reflecting a collimated beam.

These optical arrangements have a number of disadvantages.

First of all, a collimated beam or slightly convergent beam is used which requires auxiliary coupling lenses to obtain an optimal light energy transmission from the optical transmitter waveguide means to the optical receiver waveguide means.

Secondly, the use of conventional lenses as coupling means makes the size of the arrangement inconveniently large because the lenses must be surrounded by air in order to obtain a suitably large change of refractive index at the optical surfaces.

Also, mechanical holders for the lenses are required which complicates the mechanical construction.

Further, in the case of a voltage or electric field sensor using conventional lenses, the air present around the lenses limits the electric field that can be applied to the sensor before disruptive electric discharge occurs.

Graded index rod lenses may avoid the problem of air if coupled directly on to the optical waveguide, such as an optical fiber. Such an arrangement can be made compact and the optical interfaces can be filled with an electrically insulating optical cement. However, in order for the graded index rod lenses to collimate the beam from the transmitter, a relative small core diameter (max. 200 µm) optical fiber is required which limits the amount of light that can be launched into the optical fiber by the light source, hereby limiting the signal-to-noise ratio and the sensitivity of such a device, unless compensated for by a more powerful light source.

Thus, cheap visible light emitting diodes e.g. LED's emitting light in the range 500–700 nm cannot be used because they cannot supply sufficient light through such optical fibers having that small core diameter. Instead powerful and more expensive LED's emitting light in the range 800–950 nm must be used. However, LED's and polarizers working at these wavelengths as well as graded index rod lenses are expensive.

Therefore, there is a need for a method of determining induced change of polarization state of light in a polarization element which can be implemented in a compact, small and relative cheap fiber optic sensor device.

2. Prior Art Disclosure

U.S. Pat. No. 3980949 discloses a magneto-optical measuring transducer for measuring both nominal and excessive high currents, said transducer having a first magnetically saturable part and a second paramagnetical part, the outer surfaces of the first and second parts being provided with reflective materials to provide multiple passages of polarized light through the transducer. Nothing is indicated or suggested about providing reflection by means of a reflective imaging optical element and non-collimated light.

W. B. Spillman and D. H. McMahon, "Multimode Fiber Optic Sensors Based on the Photoelastic Effect", Proceedings of Fiber Optics and Laser Sensors, Arlington, Va., Apr. 5–7, 1983, SPIE, Vol.412, Paper No. 412–17, p.110–114 disclose a multimode fiber optic sensor based on the photoelastic effect in which light from an input fiber is collimated by a graded index rod lens, and the analyzed light is separated into two components and injected into two output optical fibers via graded index rod lenses.

UK Patent Application Publication No. 2159944 discloses an optical sensor, in particular an optical pressure sensor, comprising an electrically switchable optical 90° rotator. The sensor uses collimated light and does not comprise a reflective imaging optical element.

U.S. Pat. No. 4613811 discloses a fiber optic magnetooptic current sensor for measuring current flowing through a conductor comprising two components one of which has a plane reflective surface for reflecting a polarized light beam between the two components. Nothing is indicated or suggested about reflecting the polarized light by means of a reflective imaging optical element and non-collimated light.

Hulshof et al., "Optical Voltage Sensor: Application in Electric Power Systems", SPIE Vol. 798, Fiber Optic Sensors II, 1987, disclose a transmission type optical fiber voltage sensor comprising a Pockels cell of bismuth-germaniumoxide and conventional lenses or graded index rod lenses as collimating or focusing coupling means.

EP Patent Application Publication No. 0284346 discloses an optical interface coupled to a Faraday rotator device disposed in surrounding proximity to an energy transmission line in a magnetooptic current transducer which interface comprises a collimator segment coupled to a spacer lens element focusing a divergent beam of input light from a fiber optic cable into a collimated beam directed to the Faraday rotator device through a polarizing element by a parabolic surface.

U.S. Pat. No. 4841234 discloses a fiber optic voltage detector comprising an optical probe having an electro-optic material worked into a frusto-conical shape the tip of which is coated with a reflecting mirror. The optical probe comprises a collimator providing collimated light which is reflected by the reflecting mirror. Nothing is indicated or suggested about providing reflection by means of a reflective imaging optical element and non-collimated light.

U.S. Pat. No. 4948255 discloses a fiber optic optical sensing device comprising an element provided with two total reflection surfaces causing the beam path to invert its direction by 180°. The device uses light collimated by e.g. rod lenses and does not comprise a reflective imaging optical element.

DISCLOSURE OF THE INVENTION

In a primary aspect, it is the object of the present invention to provide a method and a fiber optic sensor device for determining induced change of polarization state of light in a polarization element which method can be carried out and be implemented in a compact, small, and relatively cheap device which is powered by a low power output light source and easy to mount.

It is another object of the present invention to provide such a method and device which can withstand large electrical fields without being subjected to disruptive electric discharge.

Further, it is still another object of the present invention to provide such a method and device which has a good temperature stability.

METHOD OF DETERMINING INDUCED CHANGE OF POLARIZATION STATE OF LIGHT

In one aspect, the present invention provides a method of determining induced change of polarization state of light in a polarization element comprising:

a) transmitting unpolarized light from a light source at the one end of an optical waveguide transmitter means to polarizer means at the other end;

b) polarizing the unpolarized light by the polarizer means;

c) transmitting the polarized light through the polarization element using at least one reflective optical element;

d) analyzing the transmitted polarized light from the polarization element by an analyzer means; and e) transmitting the analyzed polarized light from the one end of an optical waveguide receiver means to a light detector at the other end;

said analyzed light exiting the analyzer means from the same side as the unpolarized light enters the polarizer means;

wherein f) the unpolarized light while being polarized by the polarizer means, the polarized light while being analyzed by the analyzer means, or both, are non-collimated; and g) that the light from said other end of the optical transmitter waveguide means in the light path between the polarizer means and the analyzer means is reflected by the at least one reflective optical element focusing the reflected polarized light onto said one end of the optical receiver waveguide means.

According to the invention, the unpolarized light while being polarized by the polarizer means, the polarized light while being analysed by the analyzer means, or both, are non-collimated whereby auxiliary waveguide coupling means, particularly collimating and focusing coupling lenses, or graded index rod lenses, are avoided.

Further, according to the invention in combination with the non-collimated light, the light from said other end of the optical transmitter waveguide means in the light path between the polarizer means and the analyzer means is reflected by at least one reflective optical element focusing the reflected polarized light onto said one end of the optical receiver waveguide means, whereby the transmitter and receiver optical waveguide means can be connected to the same side of the device.

In combination the two features provides the effect that simultaneously components can be saved and focusing of the reflected polarized light onto said one end of the optical receiver waveguide means can be performed over a relatively short length-to-width ratio whereby a compact device having a relatively large proportion of active material compared to the total volume can be obtained.

Also, because a reflective surface requires little volume compared to lenses, a relatively small device can be obtained compared to conventional lens devices because the light path is used more efficiently by applying active material in the space otherwise occupied by graded index rod lenses or conventional lenses and air.

Further, because the optical transmitter and receiver waveguide means can be connected to the same side of the polarization element, the device can be made easy to mount, particularly in applications where the quantity to be measured only can be approached from the one side.

Also, by applying active material in the space otherwise occupied by lenses and particularly by air, it can withstand large electrical fields without being subject to disruptive electric discharge.

Further, because e.g. graded index rod lenses can be avoided, relatively cheap large core diameter optical waveguide means having diameters in the range 200–1000 µm can be used. Thus, a better transmission efficiency of the optical path through the apparatus from light source to detector compared to sensors using conventional 50–100 µm optical fibres can be obtained. Further, an increased signal-to-noise ratio and sensitivity is obtained compared to conventional sensors, just as a comparable accuracy is obtained at a lower optical power level. Also, an increase in sensitivity can be obtained by applying more reflective imaging elements which provides multiple transmissions through the polarization element and increases the total optical path in the polarization element.

REFLECTIVE IMAGING OPTICAL ELEMENTS

According to the invention, the polarized light in the light path between the polarizer means and the analyzer means is reflected by at least one reflective optical element so that the polarized light is transmitted one or more times through the polarization element before being analyzed.

A simple embodiment involves only one focusing reflective optical element.

Therefore, in a preferred embodiment, the polarized light is transmitted through the sensitive polarization element one or more times, preferably once or twice, by one reflective imaging optical element.

Generally, to obtain a greater sensitivity, the polarized light can be transmitted through the polarization element a multiple number of times by more reflective optical elements, at least one of which is imaging.

Specifically, a polarization element having a reflective plane surface with apertures for the light input and output and a reflective convex surface opposite to the plane surface can provide a total of four transmissions of the polarized light through the polarization element.

Therefore, in another preferred embodiment, the polarized light is transmitted through the sensitive polarization element one or more times, preferably one, two or four times, by two reflective elements at least one of which is imaging.

According to the invention, reflective imaging optical elements can be provided by methods known in the art.

In a preferred embodiment, a reflective imaging optical element consist of a convex surface of the polarization element coated with a reflective coating, the curvature of which can be provided by methods known in the art of lens manufacturing e.g. using ray tracing, provided the aperture of the optical transmitter waveguide means and the polarizer means, the thickness and index of refraction of the polarizer means, the length and index of refraction of the polarization element, the thickness and index of refraction of the analyzer means and the aperture of the analyzer means and optical receiver waveguide means are known. Further, the reflective coating can be selected from reflective coatings known in the art including metallic coatings such as Al, Ag, and Au, and dielectric coatings such as quartz, ZnS, $TiO_2$, $Sb_2O_3$.

In some cases, particularly when expensive or fragile polarization elements are applied, it may be preferred not to provide the convex surface directly on the polarization element, but on e.g. a planoconvex lens.

Therefore, in another preferred embodiment, the reflective imaging optical element consists of a planoconvex lens with a convex surface coated with a reflective coating. These lenses can be provided by methods known in the art of lens manufacturing including optical design by ray tracing.

In other cases, it may be preferred to apply a reflective diffractive optical element, particularly to avoid the relatively costly process of manufacturing a convex surface, which elements can be provided by methods known in the art including methods for manufacturing holographic or computer generated diffractive optical elements (P. Hariharan "Optical Holography", Cambridge University Press, 1984; L. Solymar and D. J. Cooke "Volume Holography and Volume Grating", Academic Press 1981; and R. R. A. Syms "Practical Volume Holography", Claradon Press, Oxford 1990).

Therefore, in still another preferred embodiment, the reflective imaging optical element consists of a diffractive optical element.

POLARIZATION ELEMENT

According to the invention, the polarization element consists of i) a sensitive polarization element comprising a suitable polarization active material in which a magnetic field, an electric field, or a mechanical force can induce anisotropy in the index of refraction, and ii) optionally an auxiliary polarization element providing phase retardation or polarization rotation of polarized light.

Polarization active materials some of which have intrinsic birefringence are known in the art and comprise:

a) electrooptic materials including crystals such as CdF, GaAs, GaP, β-ZnS, ZnSe, ZnTe, $Bi_4Ge_3O_{12}$, $Bi_{12}GeO_{20}$, $Bi_{12}SiO_{20}$, $KH_2PO_4$, $KD_2PO_4$, $NH_4H_2PO_4$, $NH_4D_2PO_4$, $LiNbO_3$, $LiTaO_3$, $KIO_3$, and quartz ($SiO_2$), and electrooptic polymer manufactured by poling of polymers such as epoxy or polymethylmethacrylate containing an electrooptic dye such as one or more azo dyes such as Disperse Red 1 (4-(4-nitrophenylazo)-N-ethyl-N-2-hydroxyethylaniline), (by poling is meant a process in which the polymer is brought to a phase transition from a mobile state to an immobile state under influence of an electric field, i.e. poling field, such that the alignment to electrooptic dye due to the poling field molecules is preserved after removal of the field. The poling process is described in Allan Göttsche: "Electrooptic and Magnetooptic Sensors for Advanced Applications in Electric Powersystems", Electric Power Engineering Department, Technical University of Denmark Publication no. 9005 (1990));

b) magnetooptic materials including glasses such as fused silica, and diamagnetic glasses such as BK7, SF6, SF57, SF58, SF59 (Shott), FR-4, FR-5, FR-7 (Hoya), and M-16 (Kigre), and crystals such as quartz ($SiO_2$,), $EuF_2$, $Tb_3Al_5O_{12}$, $LiTbF_4$, ZnSe, $CeF_3$, $LaF_3$, $Bi_4Ge_3O_{12}$, $Bi_{12}GeO_{20}$, CdMnTe $Y_3Fe_5O_{12}$ (YIG) $Tb_xY_{x-1}$(IG); and c) photoelastic materials including glasses such as ZKN7, FK5, BK7, SK14, SK16, F2, LaFN2, SF2, SF4, and SF5 (Schott).

All optical materials possess the magnetooptic Faraday effect. However, the magnitude of the effect varies. Also, some magnetooptic materials simultaneously show electrooptic effect, e.g. materials such as $Bi_4Ge_3O_{12}$, $Bi_{12}GeO_{20}$ and $Bi_{12}SiO_{20}$.

The sensitive polarization element can consist of materials selected from materials having intrinsic birefringence, and the physical dimensions can be chosen so that the intrinsic birefringence provides for a λ/4 phase retardation whereby an auxiliary polarization element can be avoided.

The auxiliary polarization element can consist of a phase retardation means preferably providing a phase retardation of λ/4 comprising phase retardation materials known in the art including dichroic retardation plates, mica retardation plates and quartz retardation plates, e.g. all such plates sandwiched between glass plates. The auxiliary polarization element is preferably used together with electrooptic or photo-elastic materials having little or no intrinsic birefringence.

As mentioned below, phase retardation means can be provided for by reflective optical elements which direct the polarized light through the polarization element whereby an auxiliary polarization element is also avoided.

TEMPERATURE AND WAVELENGTH
STABILITY ENHANCEMENT

Especially, the phase-retardation means may be incorporated so that a high tolerance against wavelength and temperature instabilities are obtained.

Phase retardation based on reflection is rather insensitive to temperature changes as a change in physical dimensions of a reflecting element, unlike birefringent phase retardation elements, does not influence the amount of phase retardation (H. Fabricius "Achromatic Prism Retarder for Use in Polarimetric Sensors", Applied Optics, Vol. 30, No. 4, 1991, pp. 426–429).

Therefore, according to the invention, phase-retardation means include phase-retardation means based on reflection.

In a preferred embodiment, the reflective imaging optical element consists of an optionally coated convex surface of the polarization element reflecting by total internal reflection.

In some cases, particularly where expensive or fragile polarization elements are applied, it may be preferred not to provide the convex surface directly on the polarization element, but instead on an additional optical element.

Therefore, in another embodiment, the reflective imaging optical element consists of an optionally coated convex surface of an additional optical element reflecting by total internal reflection.

Because phase retardation only depends on total internal reflection based on the indices of refraction of the element itself and the surrounding air, it is practically insensitive to variations in temperature. The element consists of an optical material with a convex total internal reflecting surface which, if chosen to be parabolic, is able to collimate a divergent beam emitting from the focal point of the parabolic surface, or vice versa, is able to focus a collimated beam in the focal point. If not parabolic, the convex surface will still be able to provide phase retardation, however, a collimated beam is not obtained.

When reflected, optical rays fulfilling the angular requirement of total internal reflection will obtain a phase retardation which is a function of the index of refraction of the element and the angle between the incident ray and the reflected ray. Though each ray of the beam obtains a somewhat different phase retardation, it is possible to select the index of refraction of the element, provided that the intensity distribution of the optical beam is known, so that a single reflection of the whole beam in the surface will induce an effect, which when analyzed by the analyzer and integrated on the detector can substitute the effect of a $\lambda/8$ phase retardation element.

When an optical beam is reflected twice at a single surface, or reflected at two different surfaces, the total net effect on the optical power analyzed and integrated on the detector can substitute for a $\lambda/4$ phase retardation element.

POLARIZER MEANS

The polarizer means comprises linear polarizers including dichroic sheet polarizers, glass polarizers (e.g. 8612 Polarcor™ from Corning), polarizing beamsplitters, and calcite polarizers.

ANALYZER MEANS

The analyzer means comprises means to discriminate between the polarization state of light selected by the polarizer means and the phase retardation means, if present, and the polarization state of light leaving the polarization element.

The analyzer means comprises the same type of linear polarizers as mentioned for the polarizer means.

OPTICAL TRANSMITTER AND RECEIVER WAVEGUIDE MEANS

Optical transmitter and receiver waveguide means comprises optical fibers known in the art such as single and multimode optical fibers, particularly multimode fibers having large cores are preferred.

LIGHT SOURCES AND DETECTORS

Light sources comprises suitable light sources for coupling to optical fibers including light emitting diodes (LED). Particularly low cost LED's can be used in connection with large core diameter optical fibers.

Light detector comprises suitable light detectors for coupling to optical fibers including PIN and avalanche photodiodes and phototransistors which are able to detect the light from the applied light source.

The optical power transmitted through the analyzer is proportional to the optical power emitted by the light source, but modulated by the measurement quantity.

The modulated optical signal is detected by the light detector end hereby converted to an electric current, which by electronic amplification means is converted to an electric voltage, the magnitude of which is proportional to the optical power transmitted through the analyzer. The component of the signal proportional to the measurement quantity can be extracted from noise signals and the attenuation due to loss in the optical system can be compensated for by means of electronic signal conditioning means, i.e. signal processing electronics, known in art of fiber optical sensing and polarimetric optical measurement methods. See e.g. Hulshof et al. ibid Spillman and McMahon ibid: and EP Patent Application Publications No. 0247842and 0254396.

FIBER OPTIC SENSOR DEVICES

The invention relates to sensor devices particularly fiber optic sensor devices for determining induced change of polarization state of light in a polarization element.

In another aspect the present invention provides a fiber optic sensor device for determining induced change of polarization state of light in a polarization element comprising:

a) a polarizer means for polarizing unpolarized light emitted from the one end of an optical transmitter waveguide means transmitting unpolarized light from a light source to the polarizer means;

b ) a polarization element; comprising a suitable polarization active material in which an induced anisotropy in its index of refraction changes the polarization state of said polarized light polarized by the polarizer means;

c) at least one reflective optical element for reflecting said polarized light transmitted through the polarization element; and d) an analyzer means for analyzing said polarized light reflected by the at least one reflective optical element; said analyzer means positioned at the one end of an optical receiver waveguide means transmitting the analyzed light from the analyzer means to detection means;

said analyzed light exiting the analyzer means from the same side as the unpolarized light enters the polarizer means;

wherein e) the at least one reflective optical element is arranged to focus light transmitted through the polarizer means from said one end of the optical transmission waveguide means through the analyzer means onto said one end of the optical receiver waveguide means.

A simple embodiment involves only one reflective optical element.

Therefore, in a preferred embodiment, the at least one reflective optical element consists of one focusing reflective optical element arranged to transmit the light through the sensitive polarization element.

A greater sensitivity is obtained by transmitting the polarized light through the polarization element a multiple number of times by more reflective optical elements, least one of which is focusing.

Therefore, in another preferred embodiment, the at least one reflective optical element consists of two reflective optical elements at least one of which is focusing, arranged to transmit the light through the sensitive polarization element.

The at least one reflective optical element is selected from a group consisting of:

i) a convex surface of the polarization element coated with e reflective coating;

ii) planoconvex lens with e convex surface with a reflective coating;

iii) a reflective diffractive optical element;

iv) an optionally coated convex surface of the sensitive polarization element reflecting by total internal reflection; and v) an optionally coated conves surface of an additional optical element reflecting by total internal reflection.

In a preferred, embodiment the optical waveguide transmission and receiver means consist of one or more multi mode optical fiber connected to one or more polarizer means and analyzer means, respectively.

In a preferred embodiment, the polarization element consists of a magnetooptic material; and circular birefringence is induced in the polarization element by a magnetic field or by an induced magnetic field from an electric current.

In another preferred embodiment, the polarization element consists of an electrooptic material and further comprises phase retardation means; and linear birefringence is induced in the polarization element by an electric field or by an induced electric field from an electric voltage.

In still another embodiment, the polarization element consists of a photoelastic material and further comprises phase retardation means; and linear birefringence is induced in the polarization element by mechanical force or an induced mechanical force from acceleration or pressure.

Specifically, it should be mentioned that simple sensor devices, incorporating only a single optical fiber or a single set of transmitter/receiver optical fibers, when operated according to standard polarimetric practice, can only be used to perform measurements of dynamic signals, that is to say impulse or AC signals, because the DC component of the transmitted optical signal, as obtained after the light has passed the analyzer, is used by the driver circuit of the sensor to compensate for dynamic loss in the optical fibers.

Therefore unless it is otherwise explicitly stated, the optical sensor devices described are used to measure dynamic signals, such as AC or impulse magnetic field, electric field, electric current, electric voltage or dynamic mechanical signals such as vibration, acceleration or dynamic pressure changes. Measurement of static signals (DC signals) can be performed when using more than a single set of transmitter/receiver fibers and polarizers and analyzers.

DEFINITION OF EXPRESSIONS

Within the present context the expression "fiber optic sensor+ is only intended to designate an optical sensor device supplied with fiber optic waveguides for transmission of light to and from the optical sensor device.

Therefore, the expression "fiber optic sensor" does not imply that the fiber optical waveguides themselves are the sensitive polarization elements, wherein a change of polarization state of light occurs.

Within the present context the expression "linear birefringence" designates the ability of an optical material to split up an incident wave of polarized light into two linearly polarized wave components with the polarization planes coinciding with characteristic directions of the material, which wave components are being transmitted with different propagation velocities, resulting in a phase retardation of the transmitted wave generated by recombination of the linearly polarized wave components after passing of the material, providing change in polarization state of the transmitted optical wave relative to the incident wave.

Also, phase retardation can occur by letting a polarized wave undergo a reflection at a non-zero angle, preferably as total internal reflection, or reflection by a reflection coating.

Phase-retardation means consists either of one or more media of anisotropy of refractive index, i.e. linear birefringent media, or of reflecting surfaces or a combination of the two. A phase retardation of $\pi/2$ radian or $\lambda/4$ wavelength i.e. a $\lambda/4$ waveplate can convert linearly polarized light into circularly polarized light which provides an optimal offset for a working point for the detection of induced linear birefringence, e.g. in electrooptic and photo-elastic sensors.

Further, within the present context the expression "circular birefringence" designates the phenomenon that a wave of polarized light incident on a medium of anisotropy of refractive index with respect to the direction of rotation of circularly polarized light is separated into two counter rotating circularly polarized polarization components with different propagation velocities resulting in a polarization rotation of the transmitted wave generated by recombination of the circularly polarized polarizations after passing of the material.

Circular birefringence causes the plane of polarization of linearly polarized light to rotate.

A phase retardation of $\lambda/4$ or $\pi/2$ radians causes a change from a linear to a circular polarization state.

Also, within the present context, when it is mentioned that the unpolarized light polarized by the polarizer means and the polarized light analyzed by the analyzer means, or both, are non-collimated, the expression "non-collimated" designates that the light emitted by the optical waveguide transmitter means propagate as a divergent beam through the polarizer means and polarization element propagating according to the physical laws of optical wave propagation as defined by the numerical aperture and core diameter of the optical transmitter waveguide means and the indices of refraction of the polarizer means and polarization element, and that the light collected and reflected by the at least one reflective imaging optical element is reflected back through the polarization element and analyzer means as a convergent beam propagating according to the physical laws of optical wave propagation as defined by the indices of refraction of the polarization element and the analyzer means and the aperture and focal length of the reflective imaging optical element.

Further, within the present context it should implicitly be understood that everytime the expressions "polarization element", "auxiliary polarization element", "phase-retardation means", "polarizer means", and "analyzer means" are mentioned, the characteristic optical axes of the devices mentioned are aligned according to the art of polarimetric measurement practice as described in optics literature.

That is to say that for the measurement of induced linear birefringence such as linear electrooptic effect or photoelastic effect, the polarization axes of the polarizer means and analyzer means and the so-called "fast" and "slow" optical axes of the phase-retardation means and the polarization element should all be aligned according to polarimetric measurement practice. Accordingly for the measurement of induced circular birefringence such as the magnetooptic Faraday effect, the polarization axes of the polarizer means and analyzer means and the "fast" and "slow" axes of the auxiliary polarization element, if present, and the "fast" and "slow" axes of intrinsic birefringence in the polarization element, if such intrinsic birefringence is present, should all be aligned according to polarimetric measurement practice.

Polarimetric measurement practice is described in the optics literature, specifically in:

1) Eugene Hecht: "Optics", 2n Edition, Addison-Wesley Publishing Company Inc., World Student Series (1987);

2) A. Yariv and P. Yeh: "Optical waves in crystals", Wiley-Interscience Publication, (1984);

3) Allan Göttsche: "Electrooptic and Magnetooptic Sensors for Advanced Applications in Electric Powersystems", Electric Power Engineering Department, Technical University of Denmark Publication no. 9005 (1990).

BRIEF DESCRIPTION OF THE DRAWINGS

Other objects and scopes of the present invention will become apparent from the detailed description and specific examples only illustrating preferred embodiments with reference to the drawings where

FIG. 7A shows a preferred embodiment of an electrooptic/photoelastic sensor device comprising a combination of an additional optical element including a reflective imaging optical surface and a plane mirror substituting a λ/4 optical element;

FIG. 7B shows another embodiment of the device in FIG. 7A where the sensitive polarization element is positioned between the reflective imaging optical element and the plane mirror;

FIGS. 7E1 and 7E2 show a cross sectional view along the lines VIIe—VIIe on FIG. 7A and FIG. 7D for preferred embodiments using one or two optical fibers, respectively;

FIGS. 7F1 and 7F2 show a cross sectional view along the lines VIIf—VIIf in FIG. 7B and FIG. 7C for preferred embodiments using one or two optical fibers, respectively;

FIG. 7G shows another embodiment of an electrooptic/photoelastic sensor device comprising a combination of a polarization element having a reflective imaging optical surface and an additional optical element including a plane total internal reflective surface having phase retarding properties for the substitution of a λ/4 optical element;

FIG. 7H shows a cross sectional view along the lines VIIh—VIIh in FIG. 7G for preferred embodiments using one or two optical fibers, respectively;

DETAILED DESCRIPTION

Figures 1A, 1B:
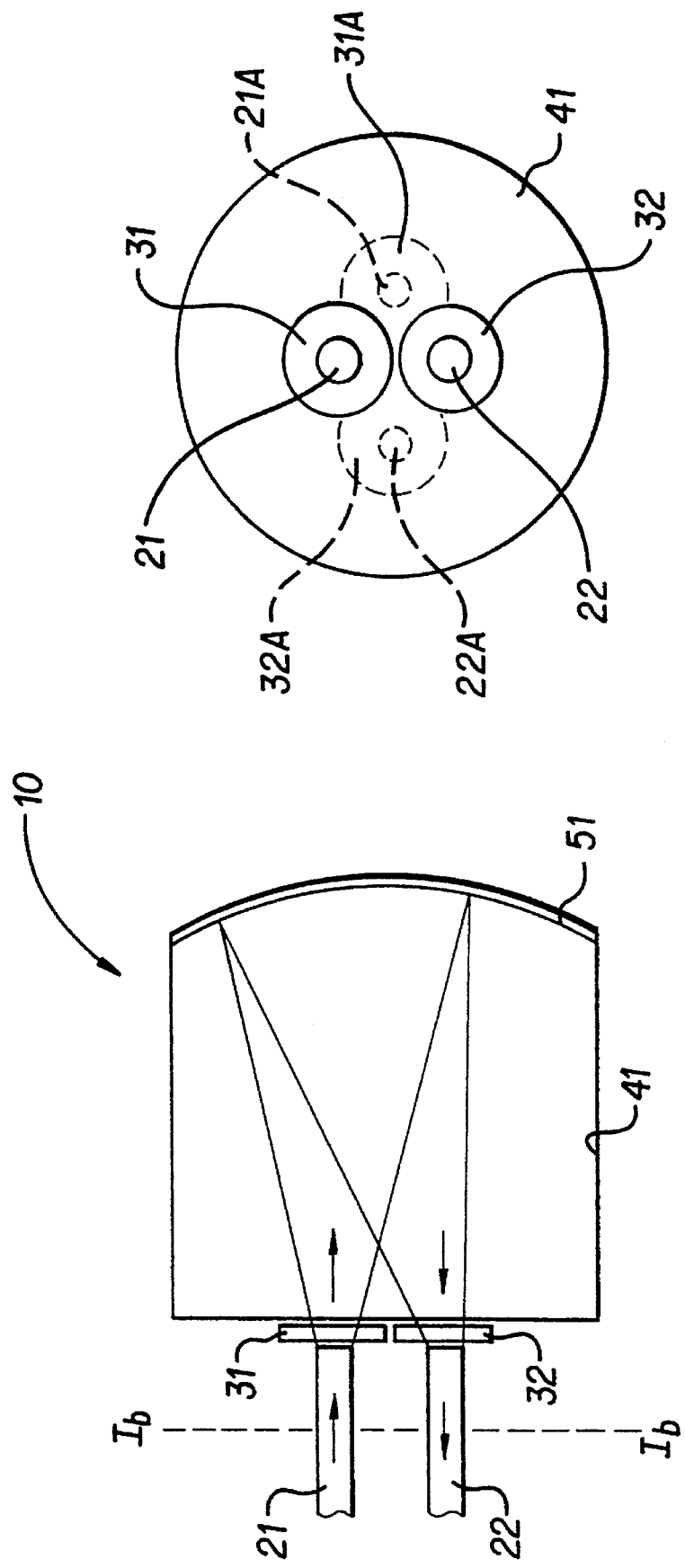
FIG 1A shows a preferred embodiment of a fiber optic magnetooptic sensor device.
FIG. 1B shows a cross sectional view along the line 1b—1b on FIG 1A.

According to the invention, the method and apparatus for determining induced change of polarization state of light in a polarization element can be used both for linearly and circularly induced birefringence in the polarization element, depending on whether the polarization active material is magnetooptic, electrooptic, or photoelastic. The only difference being the requirement of phase retardation means in case of linearly induced birefringence in electrooptic and photoelastic materials.

Thus, the detailed description of preferred embodiments should be taken to illustrate both types of birefringence, even if not explicitly stated.

If not otherwise explicitly stated, the optical axes of all optical elements have been aligned according to polarimetric measurement practice as mentioned earlier.

Magnetooptic Optical Fiber Sensor Devices

FIG. 1 shows a preferred embodiment of a magnetooptic fiber optic sensor device 10.

Unpolarized light is transmitted from a light source (not shown) at the one end of an optical fiber transmitter 21, e.g. 600 μm core multimode plastic-clad-silica fiber TECS™, Technology-Enhanced Clad Silica, FT-600-LMT (3M), to a polarizer means 31 consisting of a linear polarizer, e.g. a 8612 Polarcor™ glass polarizer from Corning, at the other end.

The unpolarized diverging light from the optical fiber 21 is polarized linearly by the polarizer 31, and transmitted through a polarization element 41 consisting of a circularly birefringent magnetooptic material causing polarization rotation when subjected to magnetic fields, e.g. the glass SF6 from Schott.

The linearly polarized but polarization rotated light is collected and reflected back through the polarization element 41 by a reflective optical surface 51 obtaining further polarization rotation. The reflective imaging optical surface 51 is a-convex surface of the polarization element 41 which is coated with a reflective coating of aluminum.

The reflected light is focused through an analyzer means 32 consisting of a linear polarizer, e.g. a 8612 Polarcor™ glass polarizer from Corning, transmitting the linearly polarised light of a selected polarization on to the one end of an optical fiber receiver 22, e.g. 600 μm core multimode plastic-clad-silica fiber TECS™, Technology-Enhanced Clad Silica, FT-600-LMT (3M), transmitting the analyzed light to a light detector (not shown) at the other end of the fiber.

Thus, applying a magnetic field, a change of polarization state of light in the polarization element 41 can be determined from the change of light intensity detected by the light detector.

Because of the symmetry of rotation of the polarization element 41, the convex surface 51, and the planoconvex lens 52, if present (see FIG. 2B), more sets of polarizers and analyzers and transmitter and receiver fibers can be positioned around the axis of symmetry e.g. for a more thorough polarization analysis for the measurement of static magnetic field or DC current.

FIG. 1B shows a cross sectional view along the line Ib—Ib on FIG. 1A indicating sets of polarizers and analyzers 31,32 and 31A, 32A, and the optical fiber transmitter/receivers 22, 22 and 21A, 22A, respectively.

Figure 1C:
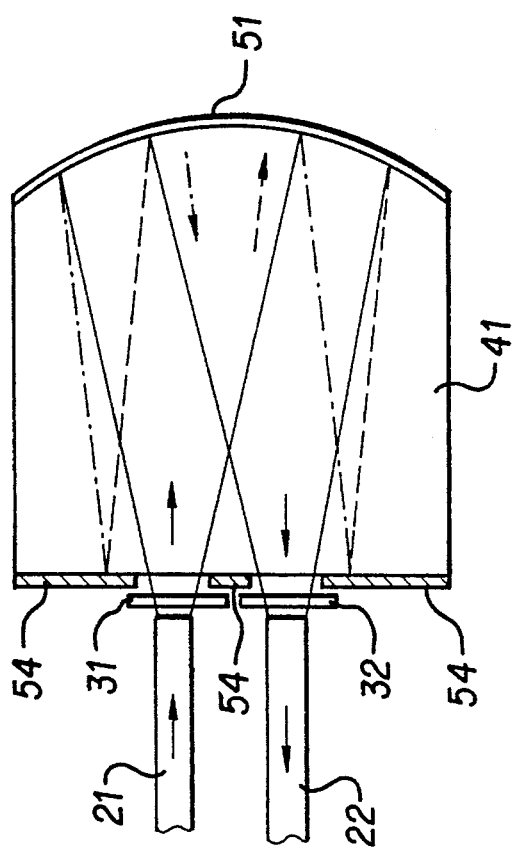
FIG. 1C shows another embodiment of the device in FIG. 1A, where the polarized light is passing the polarization element four times.

FIG. 1C shows another embodiment of the device in FIG. 1A comprising a second reflective optical element, which optionally may be imaging, but here is shown as a plane surface 54 coated with a reflective coating, except in the two apertures, where the light from the optical transmitter fiber 21 is allowed to be transmitted from the polarizer 3 into the polarization element 41, and the reflected light is transmitted from the polarization element 41 through the analyzer 32 and into the receiver fiber 22. The light from the transmitter fiber 21 is collected by the reflective optical imaging surface 51 and reflected back through the polarization element 41 here shown specifically in a collimated form, reflected forward again, still in a collimated form, by the reflective optical surface 54, and finally collected once again by the reflective optical imaging surface 51 and reflected back through the polarization element 41 again, while being focused on the receiver optical fiber 22. In this way, the polarized light is transmitted through the polarization element 41 a total of four times, hereby yielding a higher sensitivity of the sensor device.

It should be noted that the reflections within the polarization element are not restricted to light in a collimated form. Further, it should be noted that the transmission of the polarized light four times through the polarization element can be accomplished with either one of the reflective optical elements being imaging and the other being non-imaging or with both of the reflective optical elements being imaging. Consequently, it is also possible to let both of the reflective optical surfaces 51, 54 be convex imaging surfaces, or let the reflective optical surface 51 be a plane reflective surface and the reflective optical surface 54 be an imaging convex surface. By designing the two reflective optical elements correctly, it is theoretically possible to select the number of double-passes of the polarized light through the polarization element as any positive integer.

Figure 2:
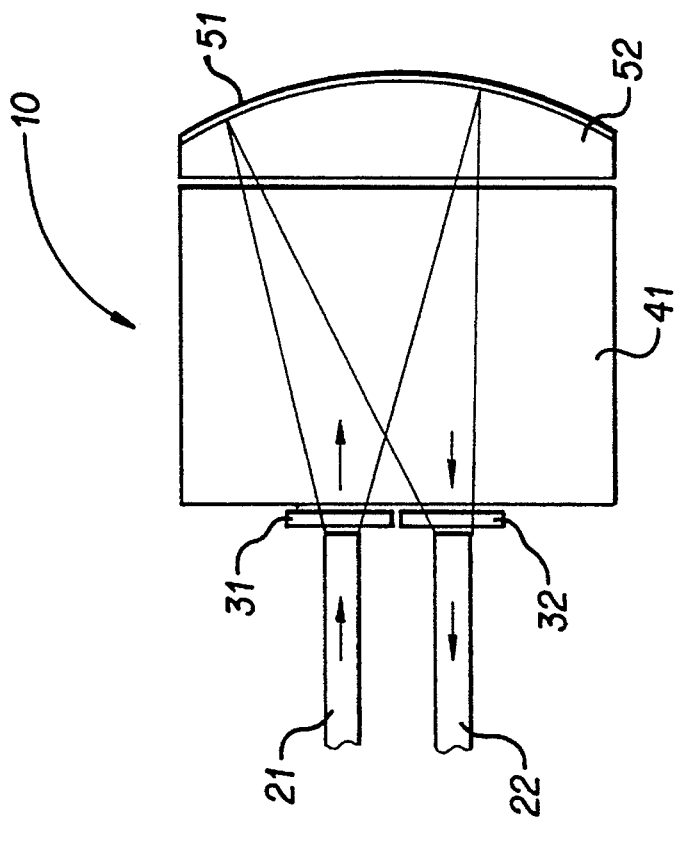
FIG. 2 shows another embodiment of the device in FIG. 1.

FIG. 2 shows another embodiment of the device in FIG. 1 comprising a planoconvex lens 52 having a convex surface coated with a reflective coating of aluminum and coupled to the polarization element 41. Optical cement, optical epoxy, or other materials may optionally be applied between the lens and the polarization element.

Figure 3:
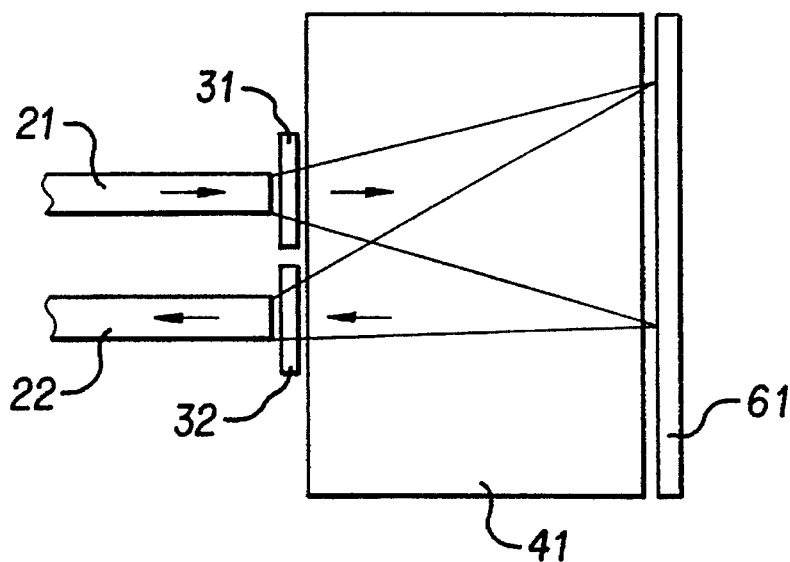
FIG. 3 shows a preferred embodiment of a fiber optic magnetooptic sensor device comprising a diffractive optical element as the reflective imaging optical element.

FIG. 3 shows another preferred embodiment of a magnetooptic optical fiber sensor device comprising a diffractive optical element 61 as the reflective imaging optical element.

Figure 4:
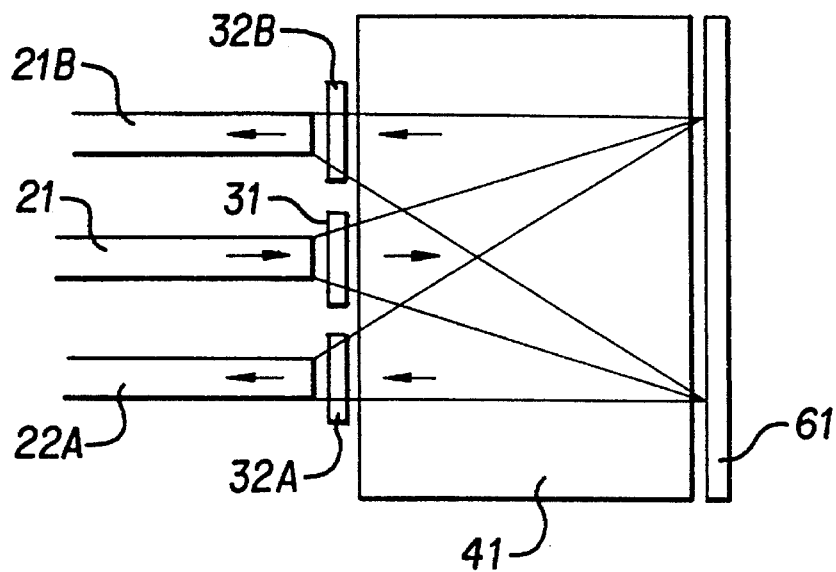
FIG. 4 shows another embodiment of the device in FIG. 3 comprising one optical fiber transmitter and two optical fiber receivers.

FIG. 4 shows another embodiment of the device in FIG. 3 comprising one optical fiber transmitter 21 and two optical fiber receivers 22A, 22B. The number of optical fiber transmitters and receivers can be increased. Thus, one transmitter and four receivers can be used for the measurement of static signals, e.g. dc current.

Electrooptic/Photoelastic Optical Fiber Sensor Devices

Figure 5A:
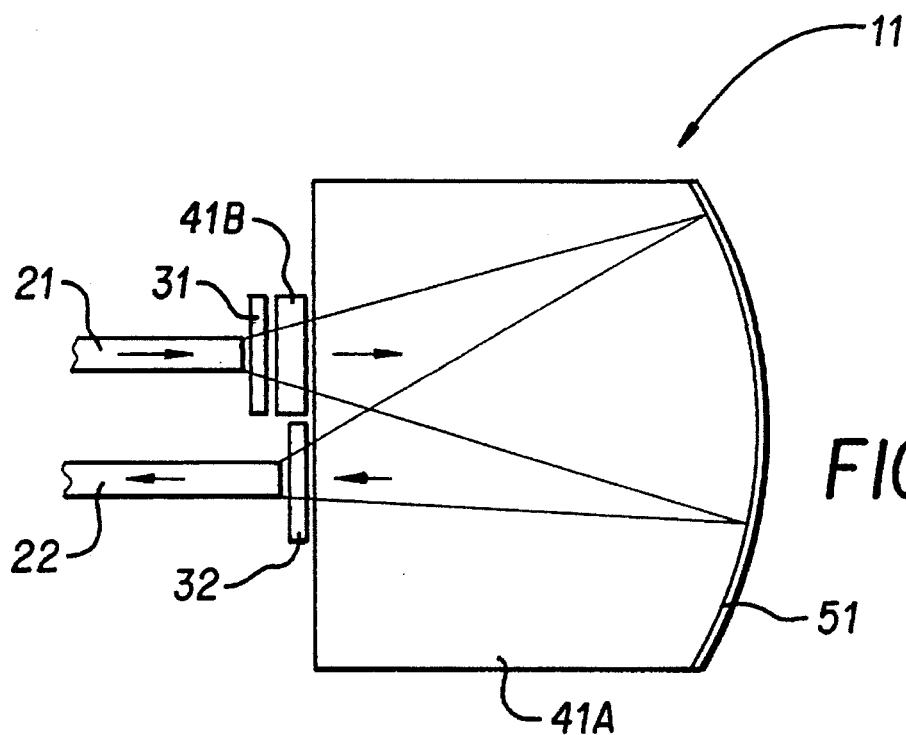
FIG. 5A, 5B, 5C and 5D show preferred embodiments of an electrooptic/photoelastic optical fiber sensor device.

FIG. 5A show preferred embodiments of an electrooptic/photoelastic optical fiber sensor device 11.

Unpolarized light is transmitted from a light source (not shown) at the one end of an optical fiber transmitter 21, e.g. a 600 μm core multimode plastic-clad-silica fiber TECS™, Technology-Enhanced Clad Silica, FT-600-LMT (3M), to a polarizer means 31 consisting of a linear polarizer, e.g. a 8612 Polarcor™ glass polarizer from Corning, at the other end.

The unpolarized diverging light from the optical fiber 21 is polarized linearly by the polarizer 31, and retarded by an auxiliary polarization element 41B consisting of a thin disc of linear birefringent material, e.g. a λ/4 quartz retardation plate. The retarded polarized light is then transmitted through a sensitive polarization element 41A and is subjected to induced phase retardation in the element. The element consists of a linear birefringent electrooptic polymer manufactured by poling of epoxy containing a sufficient concentration of the electrooptic azo dye Disperse Red 1 with the systematic name 4-(4-nitrophenylazo)-N-ethyl-N-2-hydroxyethylaniline. In case of a photoelastic sensor device, the polarization element 41A consists of a linear birefringent photoelastic material, e.g. ZKN7 Glass from Schott.

The circularly polarized light is collected and reflected back through the sensitive polarization element 41A by a reflective optical surface 51 and hereby being subjected to further phase retardation. The reflective imaging optical surface 51 is a convex surface of the sensitive polarization element 41A which is coated with a reflective coating of aluminum.

The reflected light is focused on an analyzer means 32 consisting of a linear polarizer, e.g. a 8612 Polarcor™ glass polarizer from Corning, transmitting a linearly polarised component of selected polarization on to the one end of an optical fiber receiver 22, e.g. a 600µm core multimode plastic-clad-silica fiber TECS™, Technology-Enhanced Clad Silica, FT-600-LMT (3M), transmitting the analyzed light to a light detector (not shown) at the other end of the fiber.

Thus, applying an electric field or mechanical force, a change of polarization state of light in the sensitive polarization element 41A can be determined by the change of light intensity detected by the light detector.

Figure 5B:
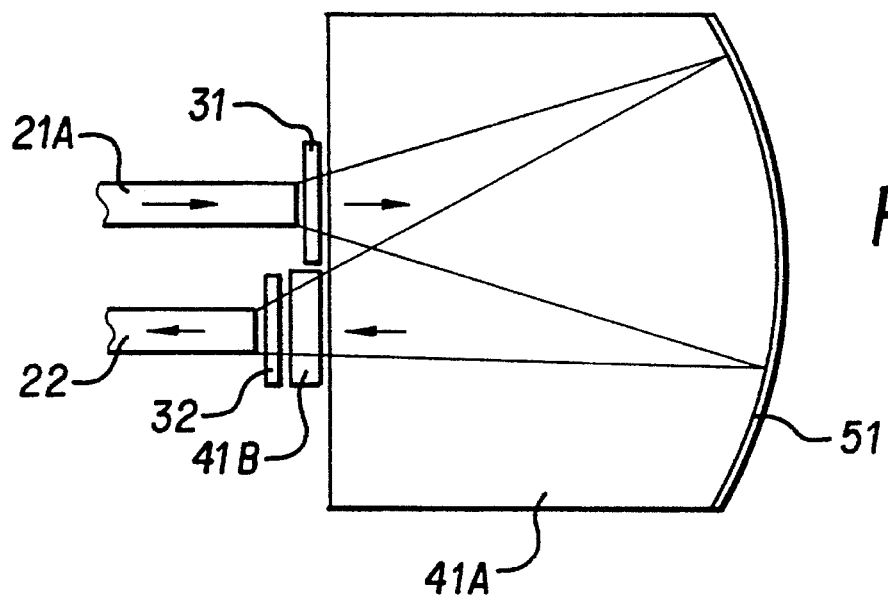

In FIG. 5B, the auxiliary polarization element 41B is positioned close before the analyzer means 32, i.e. after the reflective imaging optical surface 51 in the light path, but before the analyzer means 32.

Figure 5C:
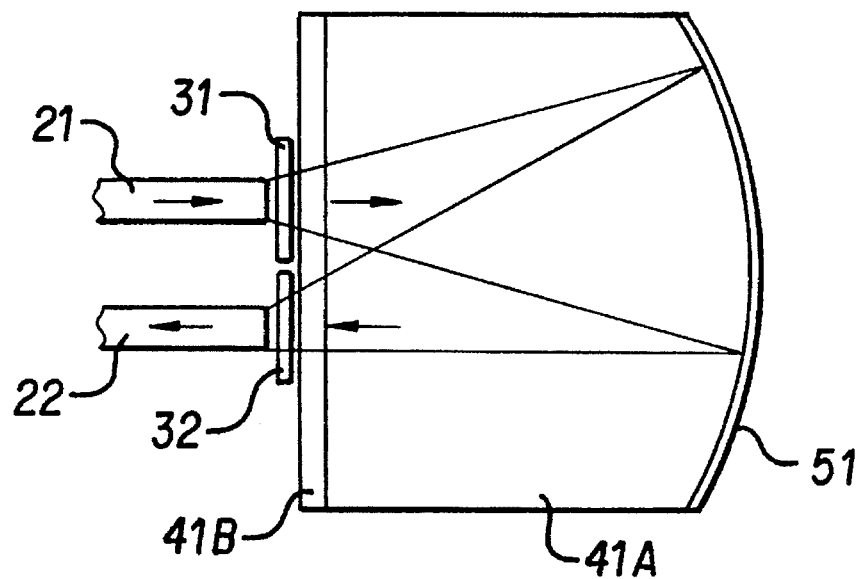

In FIG. 5C, the auxiliary polarization element 41B is integral with the sensitive polarization element 41A.

Figure 5D:
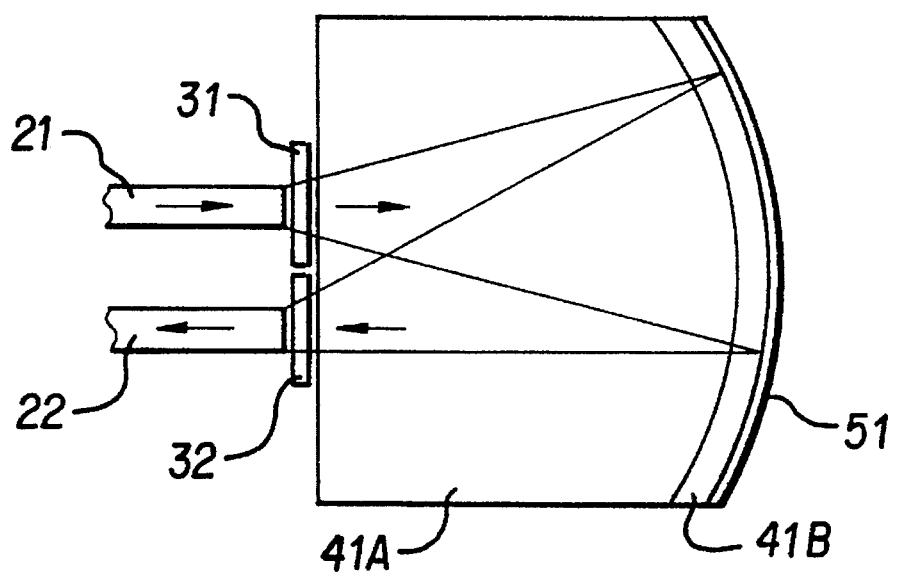

In FIG. 5D, the auxiliary polarization element 41B includes the reflective imaging optical surface 51. It should be noted that the embodiments of the reflective imaging optical element in FIGS. 2,3 and 4 consisting of the plano-convex lens 52 and the diffractive optical element 61 can also be implemented for this electrooptic/photoelastic sensor device. Likewise more sets of polarizers and analyzers, and auxiliary polarization elements and transmitter/receiver fibers can be applied parallel to what is shown in FIG. 1B and FIG. 4.

Figure 6A:
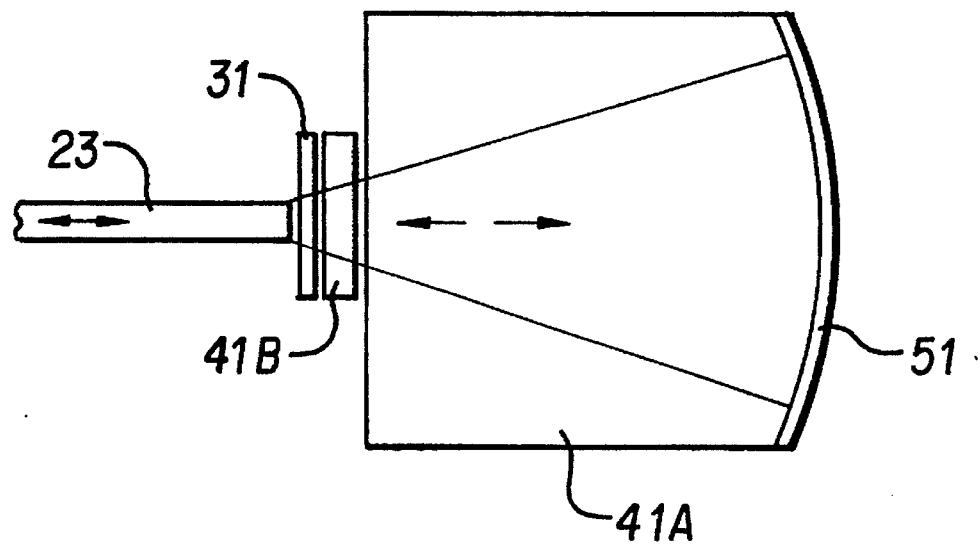
FIG. 6A shows a preferred embodiment of a magnetooptic optical fiber sensor device comprising one optical fiber simultaneously functioning as transmitter and receiver.

Magnetooptic/Electrooptic/Photoelastic Fiber optic sensor Devices Using One Optical Fiber FIG. 6A shows a preferred embodiment of a magnetooptic fiber optic sensor device comprising one optical fiber simultaneously functioning as transmitter and receiver.

Unpolarized light is transmitted from a light source (not shown) to a beam splitter or fiber splitter (not shown) and a collimator lens (not shown) at the one end of an optical fiber transmitter/receiver 23, e.g. a 600 λm core multimode plastic-clad-silica fiber TECS™, Technology-Enhanced Clad Silica, FT-600-LMT (3M), to a polarizer means 31 consisting of a linear polarizer, e.g. a 8612 Polarcor™ glass polarizer from Corning, at the other end.

The unpolarized divergent light from the optical fiber 23 is polarized linearly by the polarizer/analyzer means 31, and phase retarded by an auxiliary polarization element 41B consisting of a thin $\lambda/4$ disc of linear birefringent material, e.g. a $\lambda/4$ quartz retardation plate, and transmitted through a sensitive polarization element 41A.

The polarization rotated light is collected and reflected back through the sensitive polarization element 41A by a reflective optical surface 51 hereby obtaining further rotation polarization. The reflective imaging optical element consists of a convex surface of the sensitive polarization element 41A which is coated with a reflective coating of aluminum.

The reflected light is focused and transmited through the $\lambda/4$ retarder means providing a total phase retardation of $\lambda/2$ resulting in a rotation of the plane of polarization of $\pi/4$ radians, and through the polarizer/analyzer means 31 consisting of a linear polarizer, e.g. a 8612 Polarcor™ glass polarizer from Corning, transmitting linearly polarised light of a selected polarization on to the optical fiber transmitter/receiver 23, transmitting the analyzed light via a collimator lens (not shown) and a beam splitter or fiber splitter (not shown) to a light detector (not shown) at the other end of the fiber.

Thus, by applying a magnetic field, a change of polarization state of light in the sensitive polarization element 41A can be determined by the change of light intensity detected by the light detector.

Figure 6B:
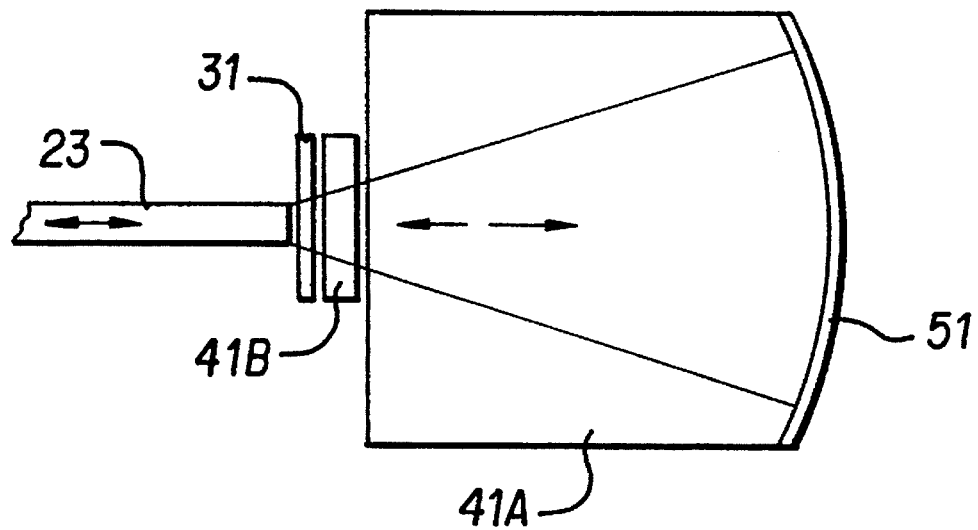
FIG. 6B shows a preferred embodiment of an electrooptic/photoelastic sensor device comprising one optical fiber simultaneously functioning as transmitter and receiver.

FIG. 6B shows a preferred embodiment of an electrooptic/photoelastic sensor device comprising one optical fiber simultaneously functioning as transmitter and receiver.

The device is similar in construction to the device shown in FIG. 6A except for the sensitive polarization element 41A being an electrooptic/photoelastic material and the auxiliary polarization element 41B being a $\lambda/8$ plate consisting of a thin disc of linear birefringent material which provides the necessary $\lambda/4$ phase retardation when passed twice by the optical beam.

Temperature and Wavelength Stability Enhanced Polarization Sensor Devices

FIG. 7A shows a preferred embodiment of an electrooptic photoelastic sensor device comprising an additional optical element 53 including a total internal reflective imaging optical surface 51A providing a temperature and wavelength stable phase retardation and including a reflective optical element optionally imaging, here shown as a plane reflective surface 54.

In FIG. 7A the optical path is similar to the one in FIG. 5A and 5B and 5C and FIG. 6A and 6B except for the single reflective imaging optical surface 51 being replaced by a parabolic total internal reflective imaging optical surface 51A on an additional optical element 53 providing a phase-retardation yielding a net effect on the reflected optical beam substituting for a $\lambda/8$ phase retardation. Consequently, two reflections of the optical beam in the surface 51A substitutes for a $\lambda/4$ phase retardation, whereby the birefringent auxiliary polarization element 41B can be avoided.

The embodiments using two optical fibers are illustrated in FIGS. 7E2 and 7F2.

Figure 7D:
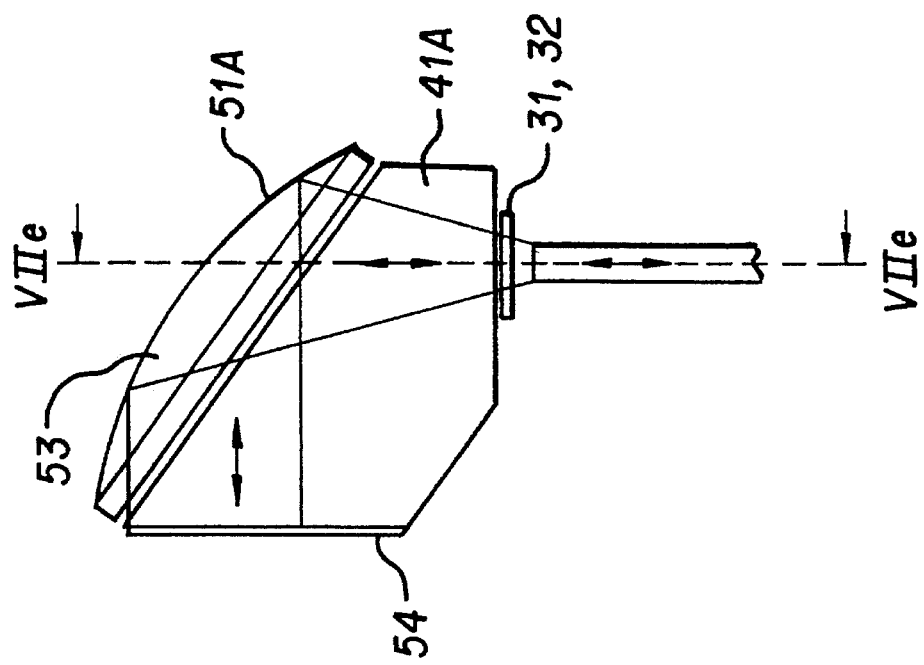
FIG. 7D shows another embodiment of the device in FIG. 7A, where the additional optical element comprising a reflective imaging optical surface is constituted by a plano-convex lens mounted on a plane surface of the sensitive polarization element.

In FIG. 7E2 there is shown cross sectional views along the lines VIIe—VIIe in FIG. 7A and 7D.

Figure 7C:
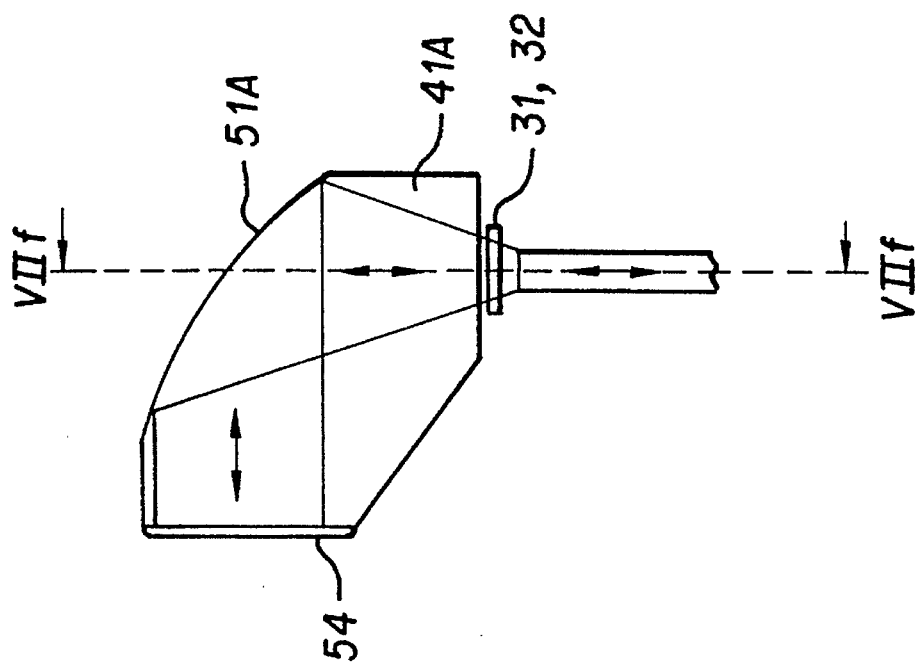
FIG. 7C shows another embodiment of the device in FIG. 7A, where the reflective imaging optical surface is a convex surface of the sensitive polarization element.

In FIG. 7F2 there is shown cross sectional views along the lines VIIf—VIIf in FIG. 7B and 7C.

The embodiments using one optical fiber are illustrated on FIG. 7E1 and FIG. 7E1.

In the embodiments shown in FIGS. 7A–7F, the unpolarized diverging light from the transmitter optical fiber is polarized linearly by the polarizer and transmitted through the sensitive polarization element 41A, entering the additional optical element 53 where it is reflected and collimated by the total internal reflective imaging optical surface 51A and directed on to a plane reflective surface 54 reflecting the light back through its original path. The surface 51A may be optionally coated with a coating of selected refractive index providing optimal amount of phase retardation. As the polarized light is phase retarded twice by the internal reflection, a total effect on the transmitted optical beam is obtained which substitutes for the effect of a λ/4 phase retardation when the beam is analyzed by the analyzer and the optical power is integrated on the detector. To get an effect as close as possible to a λ/4 phase retardation, glasses such as BaK4 or PSK3 (Schott) can be used for the manufacture of the optical element comprising the total internal reflective imaging optical surface 51A. (H. Fabricius "Achromatic Prism Retarder for Use in Polarimetric Sensors", Applied Optics, Vol. 30, No. 4, 1991, p. 426–429).

It should be noted that the phase retarding parabolic surface element providing the effect substituting for a λ/4 phase retarder is not a true λ/4 plate as it provides different retardation angles for parts of the beam emitted at different solid angles. The net effect first appears after the analyzer when the light is integrated on the detector.

FIG. 7C shows an embodiment of the device in FIG. 7A, where the additional optical element 53 is avoided by forming the total internal reflective imaging optical surface 51A in the sensitive polarization element 41A itself.

FIG. 7D shows an embodiment of the device in FIG. 7A, where the additional optical element 53 is constituted by a plano-convex lens 53, mounted on a plane surface of the sensitive polarization element 41A with the convex surface of the lens constituting the total internal reflective imaging optical surface 51A. Optical cement, optical epoxy, or other materials may optionally be applied between the lens and the polarization element.

FIG. 7G shows another embodiment of an electrooptic/photoelastic sensor device comprising a combination of a polarization element 41 having a reflective imaging optical surface 51 and an additional optical element 53 including a plane total internal reflective surface 51A having phase retarding properties for the substitution of a λ/4 optical element.

It should be noted that for this embodiment, the variation in phase retardation obtained for individual optical rays emitted at different solid angles from the optical fiber is greater than for the embodiments using an imaging total infernal reflective surface phase retardation means.

Therefore the present embodiment provides a poorer substitution for a λ/4 or λ/8 phase retarder. However, the simple geometry using a plane total internal reflective surface simplifies manufacturing of the device.

The optical paths which can be used in FIG. 7G are shown in FIGS. 7H1 and 7H2. The embodiments using two fibers are illustrated in FIG. 7H2 showing a cross sectional view along the line VIIh—VIIh. The embodiments using one optical fiber are illustrated in FIG. 7H1.

Figure 8A:
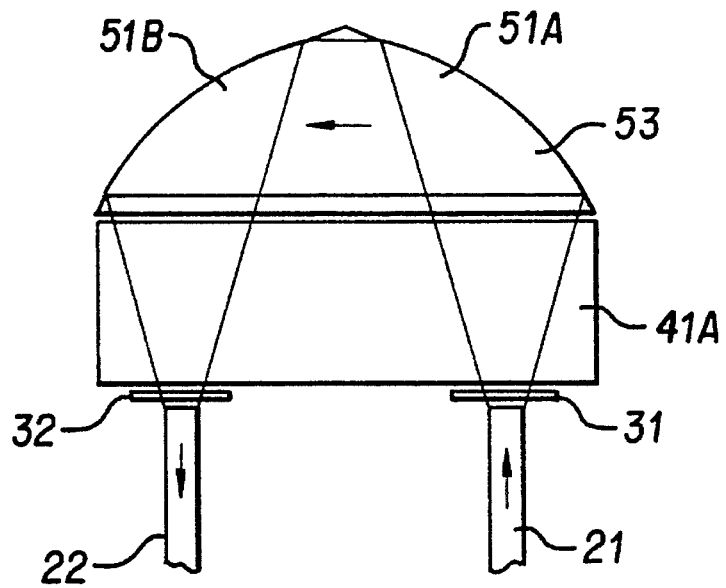
FIG. 8A shows another embodiment of the device in FIG. 7A comprising two phase retardation elements.

FIG. 8A shows another embodiment of the device in FIG. 7A comprising two phase retardation elements.

Unpolarized light provided by the optical fiber transmitter 21, e.g. a 600 μm core multimode plastic-clad-silica fiber TECS™, Technology-Enhanced Clad Silica, FT-600-LMT (3M), is polarized by the polarizer 31, e.g. a 8612 Polarcor™ glass polarizer from Corning, transmitted through the sensitive polarization element 41A to a parabolic phase retarding surface 51A of an additional optical element 53 collimating and phase retarding the polarized light on to another parabolic phase retarding surface 51B focusing the polarized light through the sensitive polarization element 41A, an analyzer 32, e.g. a 8612 Polarcor™ glass polarizer from Corning, and onto an optical fiber receiver 22.

Figure 8B:
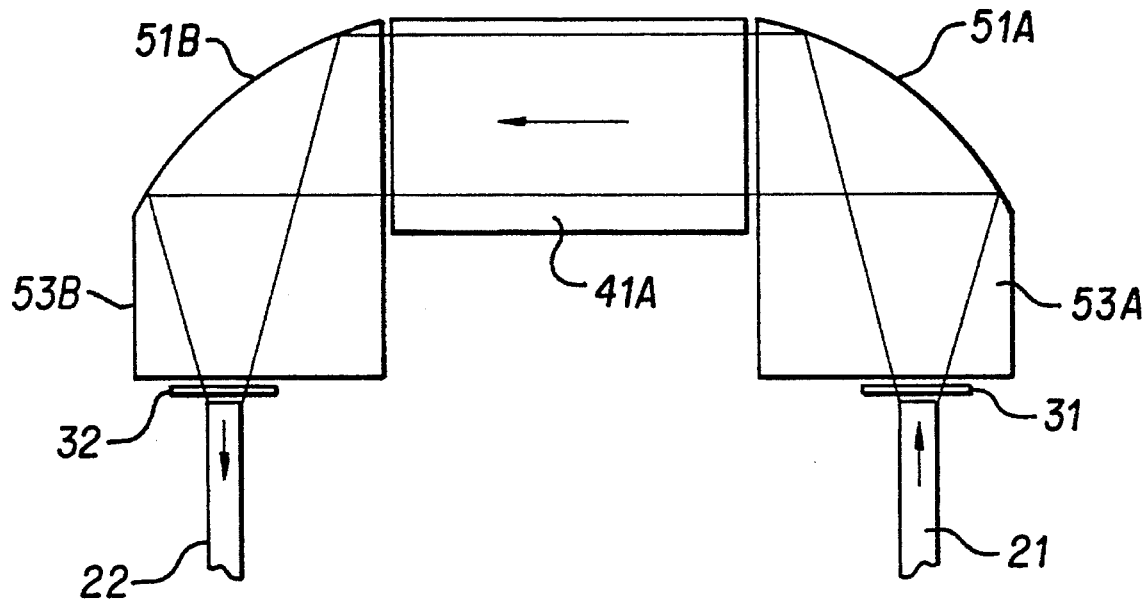
FIG. 8B shows another embodiment of the device in FIG. 7B comprising two phase retardation elements.

FIG. 8B shows another embodiment of the device in FIG. 7B where the sensitive polarization element 41A is placed between two additional optical elements 53A and 53B.

EXAMPLES

Applications

EXAMPLE 1

"Magnetooptic Fiber Optical Sensing"

Figure 9:
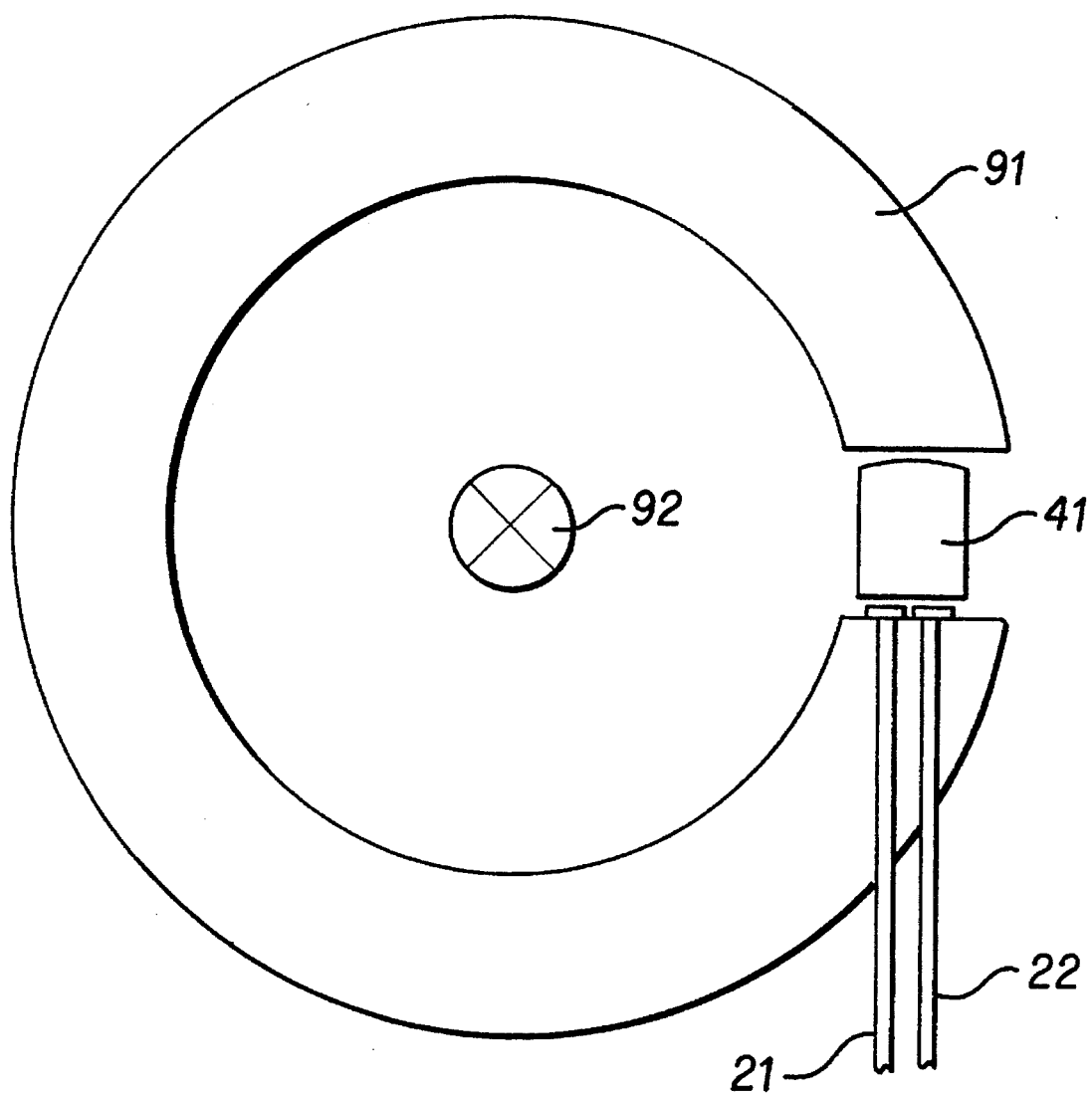
FIG. 9 shows an application of a magnetooptic fiber optic sensor device according to the invention placed in a magnetic field integrating core.

FIG. 9 shows an application of a magnetooptic fiber optic sensor device according to the invention positioned in a magnetic field concentrator core 91 around an AC current carrying conductor 92.

The concentrator core served the purpose of concentrating the magnetic field of the current in the conductor in the gap of the core, whereby a measurement of the magnetic field in the total volume of the gap of the concentrator core has proved to be a good approximation to an integration of the magnetic field in air along an arbitrary path incirculating the conductor, which according to Ampeeres law yields the current in the conductor. Therefore, when as according to the invention, the gap of the concentrator core is almost fully occupied with the magnetooptic material, the output from the magnetooptic sensor measuring the magnetic field in the gap, yields, when correctly calibrated by electronic means, a very reliable measurement of the current which is only very little sensitive to ambient magnetic fields and field perturbations and only little sensitive to the position of the conductor inside the aperture of the concentrator core.

If there are no ambient magnetic fields and no magnetic field perturbing objects present, the magnetic field strength around the conductor is directly proportional to the current flowing in the conductor and inversely proportional to the square of the distance to the conductor.

Therefore, assuming an unperturbed magnetic field and measuring a small portion of the field by a magnetooptic sensor a result is obtained, which, when properly calibrated for the distance to the conductor and the sensor characteristics by electronic means, will be a correct measurement of the current. Therefore, for some applications, the magnetic integrator core can be avoided and the magnetic field sensor directly applied.

Because of the compactness of the magnetooptic sensor it can be used to measure current even where only very little space is available. For example an application of the magnetooptic sensor is to measure current in a 10–20 kV electric power distribution cable, when the sensor with or without integrator core is placed inside a bushing terminating a single conductor of the cable. (

FIG. 11).

If the application is not critical and only low accuracy is needed, the integrator core can be avoided.

EXAMPLE 2

"Electrooptic Fiber Optical Sensing"

Figure 10A:
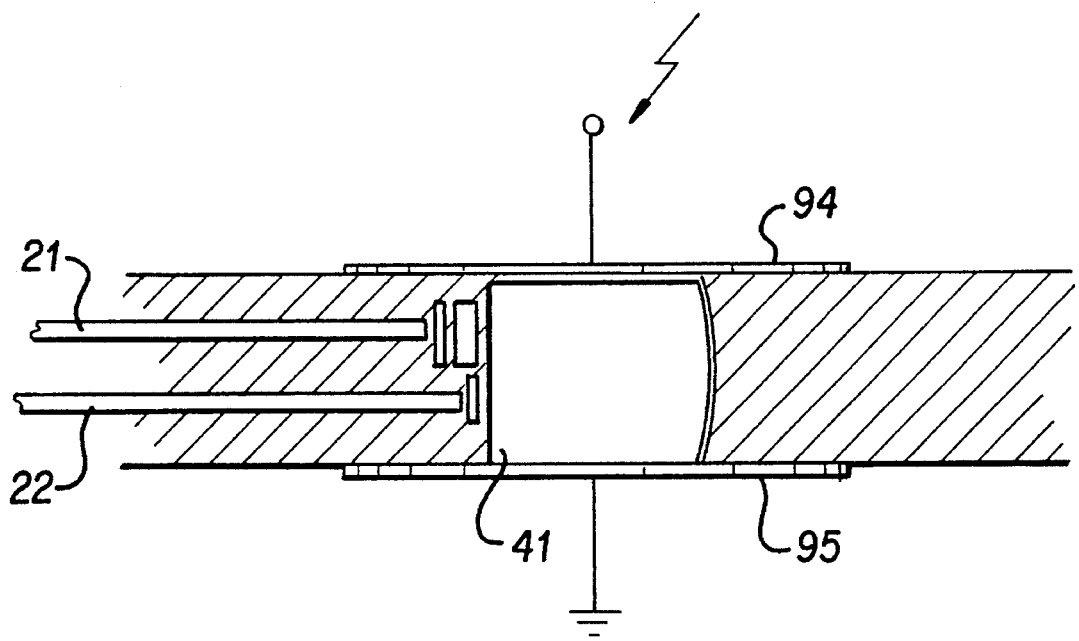
FIG. 10A shows an application of an electrooptic sensor device according to the invention placed between the electrodes of a voltage sensor.

FIG. 10A shows an application of an electrooptic sensor device according to the invention fixed between the electrodes 94, 95 of a voltage sensor cast in an insulating material.

When sensor characteristics are properly calibrated for by electronic means, the output from an electrooptic sensor placed in a homogeneous AC electric field can yield the field strength of the field. When the electrooptic sensor was placed in a fixed geometry between a set of two electrodes, the output signal could be calibrated to directly represent the voltage across the electrodes.

When the electrooptic material applied was a material with high dielectric strength such as the electrooptic polymer described in the Ph.D.-thesis by Allan Göttsche: "Magnetooptic and Electrooptic Sensors for Advanced Applications in Electric Power Systems", Publication No. 9005, (1990) Electric Power Engineering Department, Technical University of Denmark, it was possible to have high voltage directly across electrodes mounted on the electrooptic material. Because, the voltage sensor was cast in an electrically insulating material, it could be safely operated at voltages, at which a voltage sensor equipped with conventional lenses would suffer from electric discharge in the air pockets surrounding the lenses.

When electrooptic crystals were used as the electrooptic material, only relatively low voltage could be applied directly across the crystal. However, as the crystal is sensitive to electric fields, the electrooptic sensor can be cast into a block of insulating material, the dimension of which is considerably larger than the dimension of the electrooptic crystal. When the block of insulating material is equipped with electrodes and a voltage is applied, the voltage across the crystal is only a fraction of the voltage across the electrodes, as determined by the ratio of the thickness of the crystal to the distance between the electrodes and by the dielectric constants of the crystal and the insulating material.

When implemented as described above, the voltage sensor was used to measure voltage even where only very little space was available. For an example an application of the voltage sensor was to measure voltage on a 10–20 kV electric power distribution cable, when the sensor was placed between the conductor and an electrically grounded outer shield of a bushing terminating a single conductor of the cable.

Figure 10B:
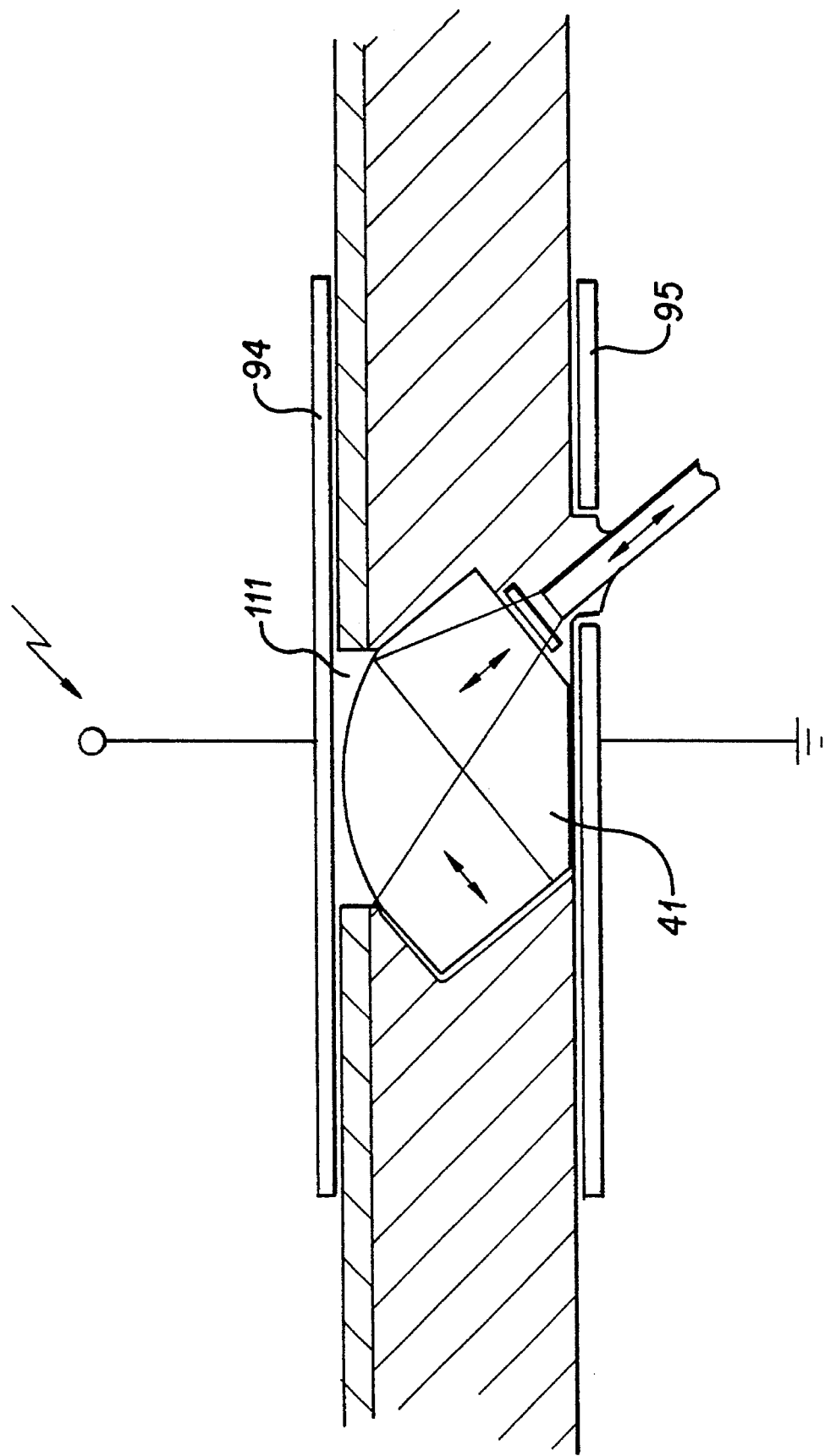
FIG. 10B shows an application of the temperature and wavelength stability enhanced electrooptic sensor device shown in FIG. 7C according to the invention placed between the electrodes of a voltage sensor.

FIG. 10B shows an application of an electrooptic sensor device according to the invention fixed between the electrodes 94, 95 of a voltage sensor cast in an electrical insulating material.

The device was similar to the one shown in FIG. 10A, except that phase retardation was provided for by the total internal reflective imaging optical surface of the polarization element as shown more detailed in FIG. 7C.

An air space 111 between the top electrode 94 and the polarization element 41 provided the necessary shift in index of refraction to provide for total internal reflection.

The device exhibited the same characteristics as described for FIG. 10A, except for being less temperature sensitive.

Figure 10C:
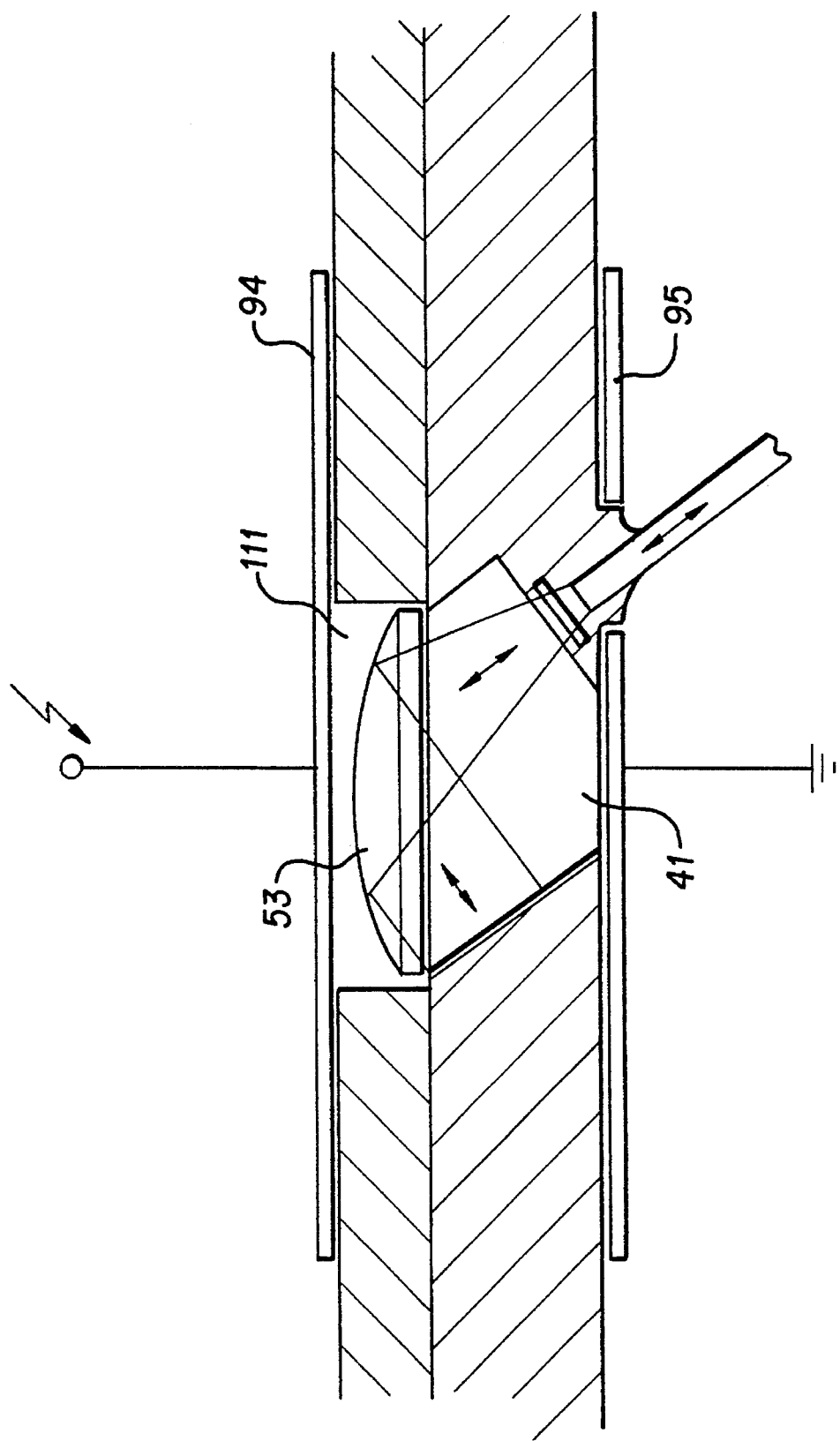
FIG. 10C shows an application of the temperature and wavelength stability enhanced electrooptic sensor device shown in FIG. 7D according to the invention placed between the electrodes of a voltage sensor.

FIG. 10C shows an application of an electrooptic sensor device according to the invention fixed between electrodes 94, 95 of a voltage sensor cast in an electrical insulating material. The device was similar to the one shown in FIG. 10B, except that the total internal reflective surface was provided for by the plane surface of the plano-convex lens (53) made of BaK4 glass (Schott) mounted on a plane surface of the polarization element. The device exhibited the same characteristics as described for FIG. 10B, including good tolerance against temperature shifts.

Figure 11:
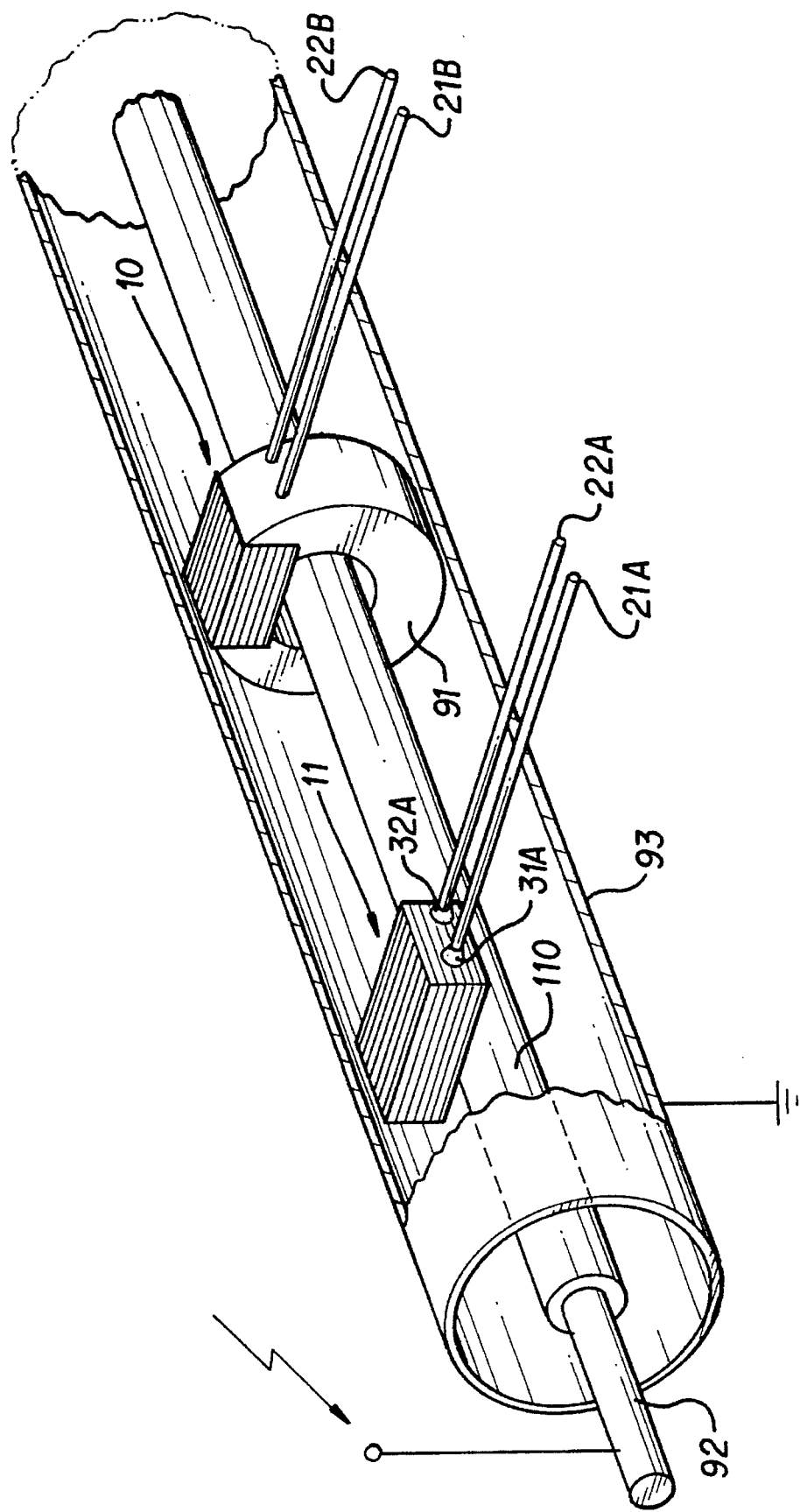
FIG. 11 shows an application of an electrooptic sensor device along with a magnetooptic sensor device including a magnetic field integrating core, both of which devices according to the invention are placed inside an electrically grounded bushing surrounding a single conductor of an electrical cable.

FIG. 11 shows an application of an electrooptic sensor device combined with a magnetooptic sensor device including a magnetic field integrating core, both of which devices according to the invention are placed inside a cable bushing (93) consisting of an electrically grounded metal tube surrounding a single phase conductor (92) of an electrical 10 kV distribution cable. The magnetooptic sensor device (10) was mounted with the magnetic field integrating core (91) surrounding the single phase conductor (92) and its primary electrical insulation 110. The electrooptic sensor device 11 was mounted between the insulated phase conductor and the surrounding electrically grounded bushing. The electrooptic sensor device was not equipped with electrodes, but simply exposed to the electrical field between the phase conductor and the surrounding bushing. The optical fibers of the sensing devices were led through holes machined in the bushing for that purpose (not shown). The test demonstrated that it was possible to mount and operate the electrooptic and magnetooptic sensor devices within the confined space available between the phase conductor and the outer shielding of the cable bushing of a 10 kV distribution cable.

EXAMPLE 3

"Photoelastic Fiber Optical Sensing"

Figure 12:
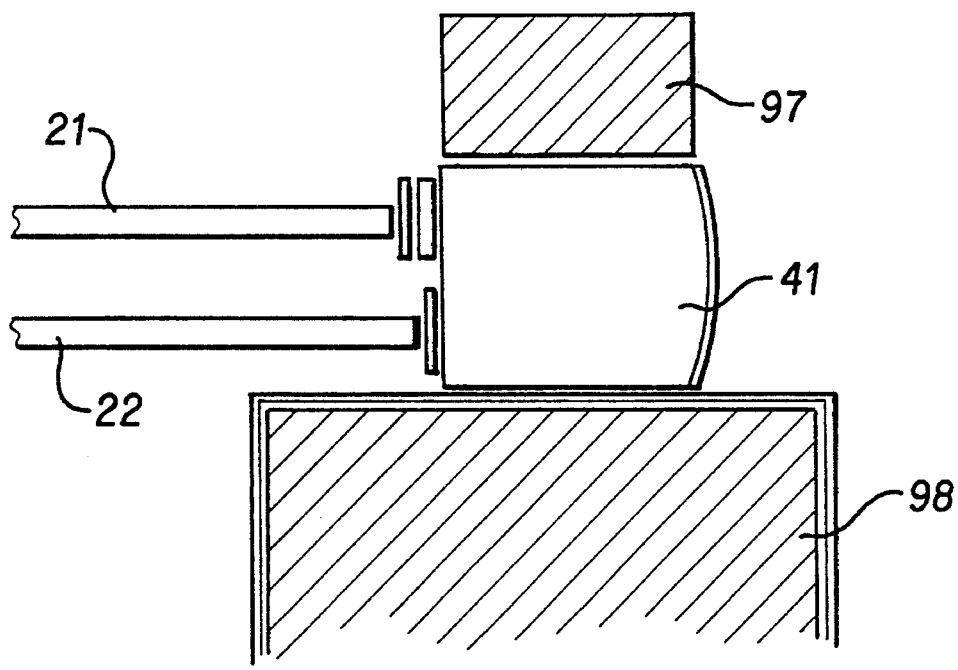
FIG. 12 shows an application of a photoelastic sensor device according to the invention placed between a floating mass and a support for measuring acceleration.

FIG. 12 shows an application of a photoelastic sensor device as an accelerometer, according to the invention positioned between a floating mass 97 and a support 98.

When the support was accelerated, mechanical tension would cause induced linear birefringence to build up in the material through photoelastic effect because of the inertia of the mass as stated by Newtons laws. When applied as described above the photoelastic sensor could be used as an accelerometer.

A typical example of an application is to monitor vibrations on machine parts hereby determining the present condition and extrapolated lifetimes of the machine parts.

Figure 13:
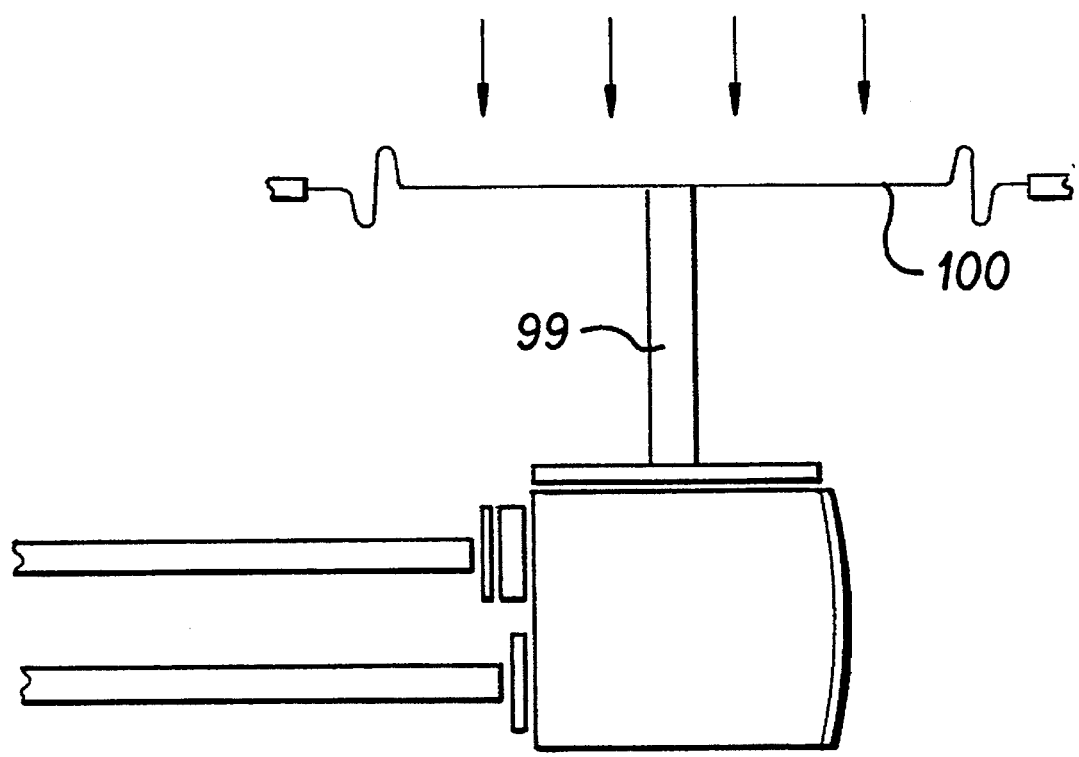
FIG. 13 shows an application of a photoelastic sensor device according to the invention which is connected via a rod to a membrane for measuring pressure.

FIG. 13 shows an application of a photoelastic sensor device according to the invention which is connected via a rod (99) to a membrane (100) for measuring dynamic pressure changes.

Differential pressure applied across the membrane resulted in mechanical forces, which via the rod provided mechanical tension in the photoelastic material causing induced linear birefringence to build up through the photoelastic effect. When applied in this way, the photoelastic sensor was used to measure dynamic pressure changes.

An application would be to measure pressure fluctuations in circulating fluid due to pump strokes. A typical example of this application would be the measurement of differential pressure between systolic and diastolic blood pressure in the human body.

I claim:

1. A method of determining induced change of polarization state of light in a polarization element comprising:

a) transmitting unpolarized light from a light source at a first end of an optical transmitter waveguide to a polarizer means at a second end of said optical transmitter waveguide, said polarizer means being light-transmissive and located directly adjacent to the optical transmitter waveguide so that the unpolarized light emitted from the second end of the optical transmitter waveguide passes through the polarizer means;

b) polarizing the unpolarized light by the polarizer means;

c) transmitting the polarized light through the polarization element using one or more reflective optical elements of which at least one is a focusing reflective optical element;

d) analyzing the transmitted polarized light from the polarization element by an analyzer means; and e) transmitting the analyzed polarized light from a first end of an optical receiver waveguide to a light detector at a second end of said optical receiver waveguide, said analyzer means being light-transmissive and located directly adjacent to the optical receiver waveguide so that the polarized light reflected by the at least one focusing reflective optical element passes through the analyzer means;

said analyzed light exiting the analyzer means from the same side of the polarization element that the unpolarized light enters the polarizer means; wherein:

f) the unpolarized light while being polarized by the polarizer means, the polarized light while being analyzed by the analyzer means, or both, are non-collimated;

g) the at least one focusing reflective optical element focuses light transmitted through the polarizer means from said second end of the optical transmitter waveguide through the analyzer means onto said first end of the optical receiver waveguide; and h) a path of light entering the polarization element from the polarizer means is substantially parallel to the path of the light exiting the polarizer element to the analyzer means.

2. A method according to claim 1, wherein the at least one focusing reflective optical element is selected from a group consisting of:

i) a convex surface of the polarization element coated with a reflective coating;

ii) a planoconvex lens with a convex surface coated with a reflective coating;

iii) a reflective diffractive optical element;

iv) an optionally coated convex surface of the polarization element reflecting by total internal reflection; and v) an optionally coated convex surface of an additional optical element reflecting by total internal reflection.

3. A method according to claim 1, wherein the light exiting said second end of said optical transmitter waveguide diverges between said second end of said optical transmitter waveguide and said at least one focusing reflective optical element, said at least one focusing reflective optical element causing the light to converge onto said first end of said optical receiver waveguide.

4. A method according to claim 1, wherein a surface of the polarization element through which the light enters the polarization element is parallel to a surface of the polarization element through which the light exits the polarization element.

5. A sensor device for determining induced change of polarization state of light in a polarization element comprising:

a) a polarizer means for polarizing unpolarized light emitted from a second end of an optical transmitter waveguide that transmits unpolarized light to the polarizer means from a light source at a first end of the optical transmitter waveguide, said polarizer means being light-transmissive and located directly adjacent to the optical transmitter waveguide so that the unpolarized light emitted from the second end of the optical transmitter waveguide passes through the polarizer means;

b) a polarization element comprising a polarization active material in which an induced anisotropy in an index of refraction of the polarization element changes the polarization state of said polarized light polarized by the polarizer means;

c) one or more reflective optical elements of which at least one is a focusing reflective optical element that reflects said polarized light transmitted through the polarization element; and d) an analyzer means for analyzing said polarized light reflected by the at least one focusing reflective optical element; said analyzer means positioned at a first end of an optical receiver waveguide that transmits the analyzed light from the analyzer means to a detection means, said analyzer means being light-transmissive and located directly adjacent to the optical receiver waveguide so that the polarized light reflected by the at least one focusing reflective optical element passes through the analyzer means;

said analyzed light exiting the analyzer means from the same side of said polarization element that the unpolarized light enters the polarizer means;

the unpolarized light while being polarized by the polarizer means, the polarized light while being analyzed by the analyzer means, or both, are non-collimated; and wherein:

e) the at least one focusing reflective optical element is arranged to focus light transmitted through the polarizer means from said second end of said optical transmitter waveguide through the analyzer means onto said first end of said optical receiver waveguide; and f) a path of the light entering the polarization element from the polarizer means is substantially parallel to a path of the light exiting the polarization element to the analyzer means.

6. A device according to claim 6, wherein the at least one focusing reflective optical element consists of one focusing reflective optical element arranged to transmit the light through the polarization element.

7. A device according to claim 5, wherein the at least one focusing reflective optical element consists of two reflective optical elements at least one of which is focusing, arranged to transmit the light through the polarization element.

8. A device according to claim 5, wherein the at least one focusing reflective optical element is selected from a group consisting of:

i) a convex surface of the polarization element coated with a reflective coating;

ii) A planoconvex lens with a convex surface coated with a reflective coating;

iii) a reflective diffractive optical element;

iv) an optionally coated convex surface of the polarization element reflecting by total internal reflection; and v) an optionally coated convex surface of an additional optical element reflecting by total internal reflection.

9. A device according to claim 5, wherein the optical transmission waveguide and the optical receiver waveguide consist of one or more multi mode optical fibers connected to one or more of said polarizer means and analyzer means, respectively.

10. A device according to claim 5, wherein the polarization element consists of a magneto optic material; and circular birefringence is induced in the polarization element by a magnetic field or by an induced magnetic field from an electric current.

11. A device according to claim 5, wherein the polarization element consists of an electrooptic material and further comprises phase retardation means; and linear birefringence is induced in the polarization element by an electric field or by an induced electric field from an electric voltage.

12. A device according to claim 5, wherein the polarization element consists of a photoelastic material and further comprises phase retardation means ; and linear birefringence is induced in the polarization element by a mechanical force or by an induced mechanical force from acceleration or pressure.

13. A device according to claim 5, wherein the light exiting said second end of said optical transmitter waveguide diverges between said second end of said optical transmitter waveguide and said at least one focusing reflective optical element, said at least one focusing reflective optical element causing the light to converge onto said first end of said optical receiver waveguide.

14. A device according to claim 5, wherein a surface of the polarization element through which the light enters the polarization element is parallel to a surface of the polarization element through which the light exits the polarization element.

* * * * *